(12) United States Patent
Korec et al.

(10) Patent No.: US 8,994,115 B2
(45) Date of Patent: Mar. 31, 2015

(54) POWER DEVICE INTEGRATION ON A COMMON SUBSTRATE

(71) Applicant: IO Semiconductor Inc., San Diego, CA (US)

(72) Inventors: Jacek Korec, Sunrise, FL (US); Boyi Yang, Cary, NC (US)

(73) Assignee: Silanna Semiconductor U.S.A., Inc., San Diego, CA (US)

( * ) Notice: Subject to any disclaimer, the term of this patent is extended or adjusted under 35 U.S.C. 154(b) by 0 days.

(21) Appl. No.: 14/305,632

(22) Filed: Jun. 16, 2014

(65) Prior Publication Data

US 2014/0291762 A1    Oct. 2, 2014

Related U.S. Application Data

(60) Division of application No. 13/939,451, filed on Jul. 11, 2013, which is a continuation-in-part of application No. 13/887,704, filed on May 6, 2013.

(60) Provisional application No. 61/677,660, filed on Jul. 31, 2012.

(51) Int. Cl.
  *H01L 21/70* (2006.01)
  *H01L 29/872* (2006.01)
  (Continued)

(52) U.S. Cl.
  CPC .......... *H01L 29/872* (2013.01); *H01L 27/0629* (2013.01); *H01L 21/823437* (2013.01);
  (Continued)

(58) Field of Classification Search
  CPC ............... H01L 27/11; H01L 27/1104; H01L 21/823807; H01L 29/6659; H01L 27/0207
  See application file for complete search history.

(56) References Cited

U.S. PATENT DOCUMENTS 4,738,936 A    4/1988  Rice
5,365,102 A   11/1994  Mehrotra et al.
(Continued)

FOREIGN PATENT DOCUMENTS

JP    11-103058    4/1999
TW    200805510    1/2008

OTHER PUBLICATIONS

Yuanzheng Zhu et al., "Folded Gate LDMOS Transistor With Low On-Resistance and High Transconductance," IEEE Transactions on Electron Devices, vol. 48, No. 12, Dec. 2001, pp. 2917-2928.
(Continued)

*Primary Examiner* — Lex Malsawma
*Assistant Examiner* — Long Le
(74) *Attorney, Agent, or Firm* — Duane Morris LLP

(57) ABSTRACT

A semiconductor structure for facilitating an integration of power devices on a common substrate includes a first insulating layer formed on the substrate and an active region having a first conductivity type formed on at least a portion of the first insulating layer. A first terminal is formed on an upper surface of the structure and electrically connects with at least one other region having the first conductivity type formed in the active region. A buried well having a second conductivity type is formed in the active region and is coupled with a second terminal formed on the upper surface of the structure. The buried well and the active region form a clamping diode which positions a breakdown avalanche region between the buried well and the first terminal. A breakdown voltage of at least one of the power devices is a function of characteristics of the buried well.

10 Claims, 27 Drawing Sheets

(51) Int. Cl.
*H01L 27/06* (2006.01)
*H01L 21/8234* (2006.01)
*H01L 27/088* (2006.01)
*H01L 29/78* (2006.01)
*H01L 29/40* (2006.01)
*H01L 29/06* (2006.01)
*H01L 29/417* (2006.01)
*H01L 29/423* (2006.01)
*H01L 29/49* (2006.01)
*H01L 29/66* (2006.01)
*H01L 29/10* (2006.01)

(52) U.S. Cl.
CPC .............. *H01L27/088* (2013.01); *H01L 29/78* (2013.01); *H01L 29/402* (2013.01); *H01L 29/0626* (2013.01); *H01L 29/41766* (2013.01); *H01L 29/4236* (2013.01); *H01L 29/4933* (2013.01); *H01L 29/66659* (2013.01); *H01L 29/66681* (2013.01); *H01L 29/66696* (2013.01); *H01L 29/66704* (2013.01); *H01L 29/7821* (2013.01); *H01L 29/7824* (2013.01); *H01L 29/7825* (2013.01); *H01L 29/7835* (2013.01); *H01L 29/1083* (2013.01); *H01L 29/1087* (2013.01); *H01L 29/1095* (2013.01)
USPC ........... 257/368; 257/336; 257/338; 257/379; 257/409; 257/664

(56) References Cited

U.S. PATENT DOCUMENTS

| | | | |
|---|---|---|---|
| 5,378,912 | A | 1/1995 | Pein |
| 5,548,150 | A | 8/1996 | Omura et al. |
| 5,559,044 | A | 9/1996 | Williams et al. |
| 5,773,852 | A * | 6/1998 | Han et al. ..................... 257/139 |
| 5,869,875 | A | 2/1999 | Hebert |
| 5,889,310 | A | 3/1999 | Terashima et al. |
| 6,025,237 | A | 2/2000 | Choi |
| 6,049,108 | A | 4/2000 | Williams et al. |
| 6,078,090 | A | 6/2000 | Williams et al. |
| 6,476,442 | B1 | 11/2002 | Williams et al. |
| 6,692,998 | B2 | 2/2004 | Maciejewski et al. |
| 6,794,719 | B2 | 9/2004 | Petruzzello et al. |
| 7,235,845 | B2 | 6/2007 | Xu et al. |
| 7,273,771 | B2 | 9/2007 | Kinzer |
| 7,282,765 | B2 | 10/2007 | Xu et al. |
| 7,420,247 | B2 | 9/2008 | Xu et al. |
| 7,446,375 | B2 | 11/2008 | Xu et al. |
| 7,560,808 | B2 | 7/2009 | Korec et al. |
| 7,576,388 | B1 | 8/2009 | Wilson et al. |
| 7,589,378 | B2 | 9/2009 | Kocon et al. |
| 7,629,645 | B2 | 12/2009 | Montanini et al. |
| 7,719,054 | B2 | 5/2010 | Williams et al. |
| 7,745,846 | B2 | 6/2010 | Korec et al. |
| 7,842,568 | B2 | 11/2010 | Anderson et al. |
| 7,952,145 | B2 | 5/2011 | Korec et al. |
| 8,101,993 | B2 | 1/2012 | Hsieh |
| 8,174,070 | B2 | 5/2012 | Mallikarjunaswamy |
| 8,674,440 | B2 | 3/2014 | Korec et al. |
| 2004/0245633 | A1 | 12/2004 | Alter et al. |
| 2006/0001110 | A1 | 1/2006 | Igarashi |
| 2006/0261382 | A1 | 11/2006 | Khemka et al. |
| 2007/0034942 | A1 | 2/2007 | Xu et al. |
| 2007/0138548 | A1 | 6/2007 | Kocon et al. |
| 2008/0122006 | A1 | 5/2008 | Williams et al. |
| 2008/0197411 | A1 | 8/2008 | Korec et al. |
| 2008/0246086 | A1 | 10/2008 | Korec et al. |
| 2009/0179264 | A1 | 7/2009 | Korec et al. |
| 2009/0273029 | A1 | 11/2009 | Tien et al. |
| 2010/0025763 | A1 * | 2/2010 | Paul et al. ..................... 257/343 |
| 2010/0127347 | A1 | 5/2010 | Quinn |
| 2010/0171543 | A1 | 7/2010 | Korec et al. |
| 2010/0237411 | A1 | 9/2010 | Hsieh |
| 2010/0301413 | A1 | 12/2010 | You |
| 2011/0024839 | A1 | 2/2011 | Zinn et al. |
| 2011/0127602 | A1 | 6/2011 | Mallikarjunaswamy |
| 2011/0148375 | A1 | 6/2011 | Xu et al. |
| 2011/0148506 | A1 | 6/2011 | Korec et al. |
| 2011/0198927 | A1 | 8/2011 | Korec et al. |
| 2011/0303976 | A1 | 12/2011 | Kocon et al. |
| 2012/0012982 | A1 | 1/2012 | Korec et al. |
| 2012/0032262 | A1 | 2/2012 | Toren et al. |
| 2012/0220091 | A1 * | 8/2012 | Challa et al. .................. 438/270 |
| 2013/0009253 | A1 | 1/2013 | Wang et al. |

OTHER PUBLICATIONS

Alan Wood, Chris Dragon and Wayne Burger, "High performance silicon LDMOS technology for 2GHz RF power amplifier applications," Motorola Inc., IEEE 0-7803-33934 1996, IEDM pp. 96-87.

I. Cortes et al., "A numerical study of field plate configurations in RF SOI LDMOS transistors," Solid-State Electronics 50 (2006) 155-163.

Honeywell Technical Note, "CMOS SOI Technology," Honeywell Solid State Electronics Center, Plymouth, Minnesota, Published Oct. 2001, pp. 1-7.

S.B. Goody and P.H. Saul, "A Fully Oxide-Isolated Bipolar Transistor Integrated Circuit Process," Semiconductor Wafer Bonding: Physics and Applications III (ECS Proceedings series, PV 95-7, Pennington, NJ, 1995) 400, 11 pages.

Mansun Chan et al., "A High Performance Lateral Bipolar Transistor From a SOL CMOS Process," Proceedings 1995 IEEE International SOI Conference, Oct. 1995, pp. 90-91.

I-Shan Michael Sun et al., "Lateral High-Speed Bipolar Transistors on SOI for RF SoC Applications," IEEE Transactions on Electron Devices, vol. 52, No. 7, Jul. 2005, pp. 1376-1383.

Andrew Marshall and Sreedhar Natarajan, "SOI Design Analog, Memory and Digital Techniques," © 2002 Kluwer Academic Publishers, New York, Boston, Dordrect, London, Moscow; Chapter 3 Components, pp. 47-62.

I. Cortes et al., "A Numerical Study of Field Plate Configurations in FR SOI LDMOS Transistors," Solid-State Electronics 50, Elsevier, pp. 58-63, Dec. 2005.

International Search Report and Written Opinion of the International Searching Authority dated Sep. 30, 2013 in related International Application No. PCT/US2013/050700.

Search report dated May 5, 2014 from related ROC (Taiwan) Patent Application No. 102127301.

Notice of Co-Pending U.S. Appl. No. 13/939,422, filed Jul. 11, 2013 and U.S. Appl. No. 13/939,490, filed Jul. 11, 2013.

Office Action dated Jul. 11, 2013 issued in parent U.S. Appl. No. 13/939,451.

* cited by examiner

US 8,994,115 B2

POWER DEVICE INTEGRATION ON A COMMON SUBSTRATE

CROSS-REFERENCE TO RELATED APPLICATION(S)

This patent application is division of and claims the benefit of co-pending U.S. patent application Ser. No. 13/939,451 filed on Jul. 11, 2013, entitled "Power Device Integration on a Common Substrate", which is a continuation-in-part of and claims the benefit of U.S. patent application Ser. No. 13/887,704 filed on May 6, 2013, entitled "Power Device Integration on a Common Substrate", which claims priority to U.S. Provisional Patent Application Ser. No. 61/677,660 filed on Jul. 31, 2012, entitled "Power Management Integrated Circuit for Portable Electronic Devices," the disclosure of each of which is incorporated herein by reference in its entirety for all purposes.

FIELD OF THE INVENTION

The present invention relates generally to electronic circuits, and more particularly relates to power device integration.

BACKGROUND OF THE INVENTION

Modern portable electronic devices, including, but not limited to, smart phones, laptop and tablet computing devices, netbooks, etc., are battery operated and generally require power supply components for stabilizing the supply voltage applied to subsystems in the devices, such as, for example, microprocessors, graphic displays, memory chips, etc. The required power range is often between about 1 watt (W) and about 50 W.

Power supply/management components are usually partitioned into functional blocks; namely, control circuitry, driver stage and power switches. From the standpoint of device miniaturization, which is a desired objective of many portable electronic devices, it is advantageous to integrate the power supply/management components into a single integrated circuit (IC) chip. This solution is particularly dominant in very low power consumption products, where supply current is limited to a few hundreds of milliamperes (mA). FIG. 1 is a block diagram illustrating an exemplary power stage which includes power management control circuitry 102, a driver stage 104, and power switches 106 and 108, all monolithically integrated in a single IC 100.

Typically, metal-oxide-semiconductor field-effect transistor (MOSFET) devices are used to implement the power switches. A MOSFET requires relatively few mask steps to be manufactured (e.g., less than about ten mask levels), while control circuitry in the IC usually requires a relatively large number of mask steps (e.g., about 26 to 36 mask levels) in comparison to MOSFET devices. Consequently, an allocation of a large die area to the power switch leads to a high product cost, which is undesirable.

SUMMARY OF THE INVENTION

Embodiments of the invention provide novel semiconductor structure and techniques for facilitating the integration of circuits and/or components (e.g., drivers and power switches) on the same silicon substrate as corresponding control circuitry for implementing a power control device. To accomplish this, embodiments of the invention exploit features of a BiCMOS IC fabrication technology implemented on silicon-on-insulator (SOI) substrates with dielectric lateral isolation.

In accordance with an embodiment of the invention, a semiconductor structure for facilitating an integration of power devices on a common substrate includes a first insulating layer formed on the substrate and an active region having a first conductivity type formed on at least a portion of the first insulating layer. A first terminal is formed on an upper surface of the semiconductor structure and electrically connects with at least one other region having the first conductivity type formed in the active region. The semiconductor structure further includes a buried well having a second conductivity type formed in the active region, the buried well being coupled with a second terminal formed on the upper surface of the semiconductor structure. The buried well is configured, in conjunction with the active region, to form a clamping diode, a breakdown voltage of at least one of the power devices being a function of one or more characteristics of the buried well. The clamping diode is operative to locate a breakdown avalanche region between the buried well and the first terminal in the semiconductor structure.

In accordance with another embodiment of the invention, a semiconductor structure for facilitating an integration of power devices on a common substrate is provided, at least one of the power devices including a bipolar junction transistor (BJT). The semiconductor structure includes a first insulating layer formed on the substrate, an active region having a first conductivity type formed on at least a portion of the first insulating layer, and a first region having the first conductivity type formed in the active region proximate an upper surface of the active region. A collector region having the first conductivity type is formed in at least a portion of the first region proximate an upper surface of the first region, the collector region having a higher doping concentration compared to the first region. A collector terminal formed on an upper surface of the semiconductor structure is electrically connected with the first region. The semiconductor structure further includes a buried well having a second conductivity type formed in the active region. The buried well is configured, in conjunction with the active region, to form a clamping diode operative to position a breakdown avalanche region between the buried well and the collector terminal, a breakdown voltage of the BJT being a function of one or more characteristics of the buried well. A base region having the second conductivity type is formed in the active region on at least a portion of the buried well and extending laterally to the first region. An emitter region having the first conductivity type is formed in an upper surface of the base region, the emitter region being connected with an emitter terminal formed on the upper surface of the semiconductor structure. A base structure is formed on the upper surface of the semiconductor structure above a junction between the base region and the first region, the base structure being electrically connected with the buried well and a base terminal formed on the upper surface of the semiconductor structure.

In accordance with yet another embodiment of the invention, a semiconductor structure for facilitating an integration of power devices on a common substrate includes a first insulating layer formed on the substrate, an active region having a first conductivity type formed on at least a portion of the first insulating layer, a first terminal formed on an upper surface of the semiconductor structure and electrically connecting with at least one other region having the first conductivity type formed in the active region, and a buried well having a second conductivity type formed in the active region. The buried well is configured, in conjunction with the active region, to form a clamping diode operative to position a breakdown avalanche region between the buried well and the first terminal, a breakdown voltage of at least one of the power devices being a function of one or more characteristics of the buried well. The semiconductor structure further includes a gate structure formed on the upper surface of the semiconductor structure above at least a portion of the buried well and proximate an upper surface of the active region. The gate structure is electrically isolated from the active region and electrically connected with the buried well.

In accordance with still another embodiment of the invention, a method of integrating one or more power devices on a common substrate includes the steps of: forming a first insulating layer on the substrate; forming an active layer having a first conductivity type on at least a portion of the first insulating layer; forming a lateral dielectric isolation through the active layer between at least first and second active regions in the active layer, the first and second active regions being electrically isolated from one another by the lateral dielectric isolation; forming at least one buried well having a second conductivity type in at least the first active region proximate an interface between the active layer and the first insulating layer; forming a gate structure on an upper surface of the semiconductor structure above at least a portion of the buried well and proximate an upper surface of the first active region, the gate structure being electrically isolated from the first active region and electrically connected with the buried well; forming at least a first region having the first conductivity type in at least a portion of the first active region proximate the upper surface of the first active region, the first region having a higher doping concentration than the first active region, the gate structure at least partially overlapping an interface between the first active region and the first region; and forming at least first and second terminals on the upper surface of the semiconductor structure, the first terminal being electrically connected with the buried well, and the second terminal being electrically connected with the first region; wherein the buried well is configured, in conjunction with the first active region, to form a clamping diode operative to position a breakdown avalanche region between the buried well and the second terminal, a breakdown voltage of at least one of the power devices being a function of one or more characteristics of the buried well.

Embodiments of the invention will become apparent from the following detailed description thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
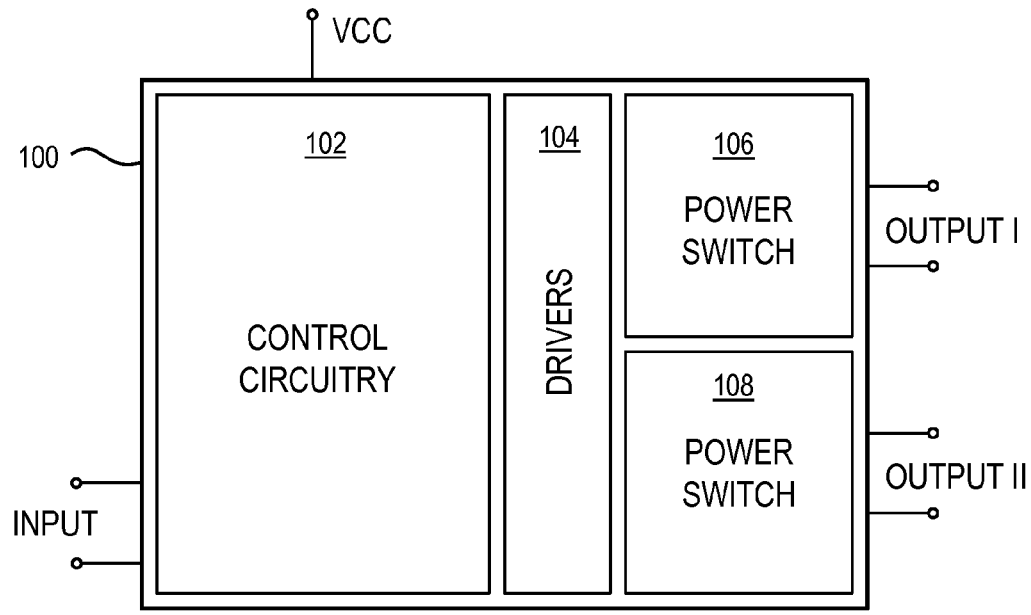
FIG. 1 is a block diagram illustrating an exemplary power management circuit including control circuitry, a driver stage and power switches implemented in a single IC.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

Embodiments of the invention will be described herein in the context of illustrative power management circuits and semiconductor fabrication methods for forming one or more components suitable for use in the illustrative power management circuits. It should be understood, however, that embodiments of the invention are not limited to the particular circuits and/or methods shown and described herein. Rather, embodiments of the invention are more broadly related to techniques for fabricating an integrated circuit in a manner which achieves high-frequency performance for a variety of power management applications, such as, for example, a DC/DC power converter, and advantageously reduces the physical size and cost of external components which may be used in conjunction with embodiments of the invention, such as, for example, an output filter, among other benefits. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

For the purpose of describing and claiming aspects of the invention, the term MOSFET as used herein is intended to be construed broadly so as to encompass any type of metal-insulator-semiconductor field-effect transistor (MISFET). The term MOSFET is, for example, intended to encompass semiconductor field-effect transistors that utilize an oxide material as their gate dielectric, as well as those that do not. In addition, despite a reference to the term "metal" in the acronyms MOSFET and MISFET, a MOSFET and/or MISFET according to embodiments of the invention are also intended to encompass semiconductor field-effect transistors having a gate formed from a non-metal, such as, for instance, polysilicon.

Although implementations of the present invention described herein may be implemented using p-channel MISFETs (hereinafter called "PMOS" or "PFET" devices) and re-channel MISFETs (hereinafter called "NMOS" or "NFET" devices), as may be formed using a BiCMOS (bipolar complementary metal-oxide-semiconductor) fabrication process, it is to be appreciated that the invention is not limited to such transistor devices and/or such a fabrication process, and that other suitable devices, such as, for example, laterally diffused metal-oxide-semiconductor (LDMOS) devices, bipolar junction transistors (BJTs), etc., and/or fabrication processes (e.g., bipolar, complementary metal-oxide-semiconductor (CMOS), etc.), may be similarly employed, as will be understood by those skilled in the art given the teachings herein. Moreover, although embodiments of the invention are fabricated in a silicon wafer, embodiments of the invention can alternatively be fabricated on wafers comprising other materials, including but not limited to gallium arsenide (GaAs), gallium nitride (GaN), indium phosphide (InP), cadmium selenide (CdSe), cadmium telluride (CdTe), zinc sulfide (ZnS), etc.

As previously stated, when device current is limited to a few hundreds of milliamperes (i.e., device power consumption less than about two watts), the illustrative power stage can be monolithically integrated in a power management circuit architecture as shown in FIG. 1, wherein the control circuitry 102, driver stage 104 and power switches 106, 108 are all fabricated on the same IC chip 100. However, when device power consumption increases beyond about five watts or so (e.g., greater than about two amperes (A)), an alternative partitioning of the power management circuit is advantageous and/or required.

Figure 2:
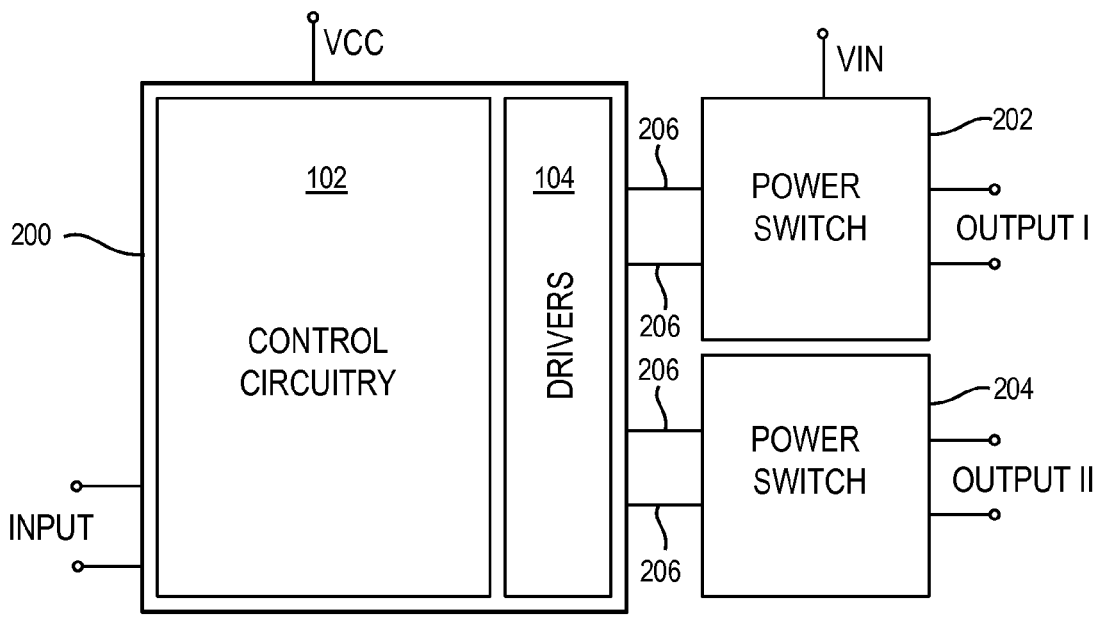
FIG. 2 is a block diagram illustrating a power stage including exemplary power management control circuitry and a driver stage implemented in an IC, coupled with discrete power switches external to the IC.

For example, FIG. 2 is a block diagram illustrating an exemplary power stage comprising power management control circuitry 102 and a driver stage 104 implemented in a first IC 200, and power switches implemented in individually packaged discrete IC devices, 202 and 204, coupled with and external to the first IC. Unfortunately, while this solution enables the control circuitry to be fabricated separately from the power switches, and thus benefit from an ability to individually optimize the fabrication process for each IC, parasitic impedances (primarily parasitic inductance) associated with interconnections 206 (e.g., printed circuit traces, bond wires, ball grid array (BGA), etc.) between the first (control) IC 200 and the power switch ICs 202 and 204, essentially prevent this approach from being used in high-frequency applications (e.g., above about one megahertz). However, this approach is generally used for power conversion in the range of about 5-30 watts.

Figure 3:
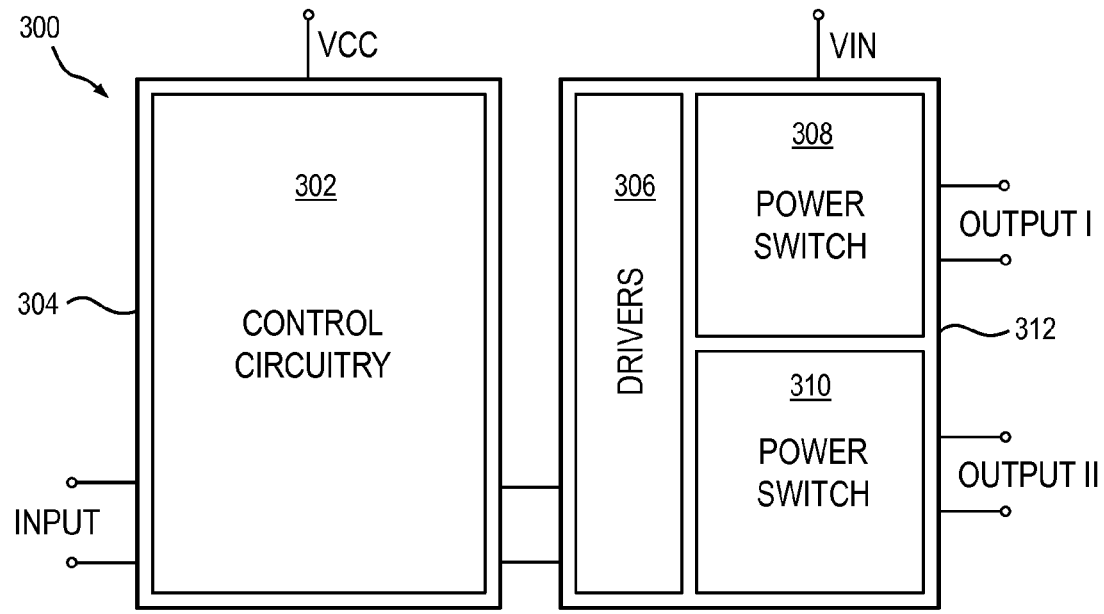
FIG. 3 is a block diagram illustrating a power stage including exemplary power management control circuitry implemented in a first IC, and a driver stage and power switches implemented in a second IC coupled with the first IC, suitable for use in accordance with embodiments of the invention.

FIG. 3 is a block diagram illustrating at least a portion of an exemplary power stage 300 comprising power management control circuitry 302 implemented in a first IC 304, and a driver stage 306 and power switches 308 and 310 implemented in a second IC 312 coupled with the first IC, according to an embodiment of the invention. The partitioning of the power stage 300 as shown in FIG. 3 is applied, for example, to DC/DC converters and other circuits and subsystems with a power conversion larger than about 30 watts. More particularly, the power stage 300 is partitioned into a control IC 304, fabricated in a more complex digital VLSI (very large scale integration) technology process, and a power block 312 implemented as a multi-chip module (MCM) including the driver stage 306, fabricated in an analog technology, and discrete power switches 308 and 310 integrated as bare dies in the MCM.

The MCM approach of FIG. 3 is used for power management systems for large power applications, e.g., for desktop computers. In this case the module contains three separate dies: driver chip and two MOSFET power switches. Portable electronics puts a strong demand on miniaturization of the implemented subsystems (i.e., small volume), and on reducing power losses generated in power conversion stages. Thus, aspects of the invention provide a cost-effective technology solution allowing a monolithic integration of driver stages with power switches which enable a two-die solution according to the partition scheme shown in FIG. 3. That is, the driver and FET power switches can be manufactured on the same die for medium power applications needed for battery operated portable electronics. There is presently no technology enabling such system partitioning for a power range higher than about five watts.

Typically, a digital/analog process, such as, for example, a BiCMOS technology, is developed with an aim to maximize integration density and speed of signal processing. Optional power switches which can be designed using existing doping profiles and process steps generally cannot achieve sufficient performance in a power management application. The reduction of transistor on-resistance and the reduction of switching power loss require a dedicated optimization of the doping structure and use of a tailored sequence of process steps. This is usually done in the design of discrete power switches only. On the other hand, the processing of discrete power switches does not allow a monolithic integration of different electronic components, including NFETs, PFETs, bipolar junction transistors, P-N junction and Schottky diodes, etc.

Power management systems (e.g., DC/DC converters) typically use power switches to perform a high-frequency chopping of the input power and use an output filter comprising inductors and capacitors to stabilize the output voltage under variable load conditions. The higher the switching frequency, the better the power conversion performance, and smaller volume and cost of the required output filter. An increase in the switching frequency from about 1 megahertz (MHz) available today to about 5 MHz is desired but has not been achievable due to associated switching power losses in the power transistors used to implement the power switches which are attributable, at least in part, to device parasitic impedances (e.g., internal capacitance, inductance, and resistance).

Figure 4:
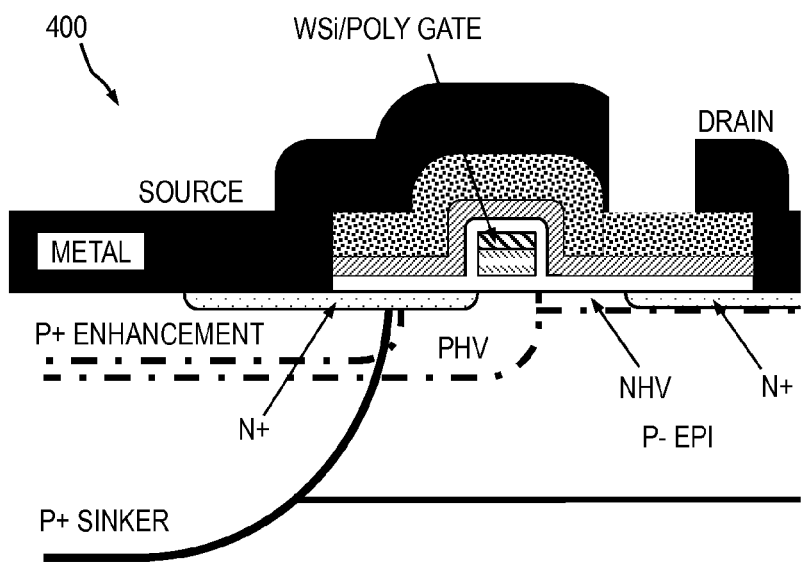
FIGS. 4 and 5 are cross-sectional views depicting conventional laterally diffused metal-oxide-semiconductor (LDMOS) transistor devices.
Figure 5:
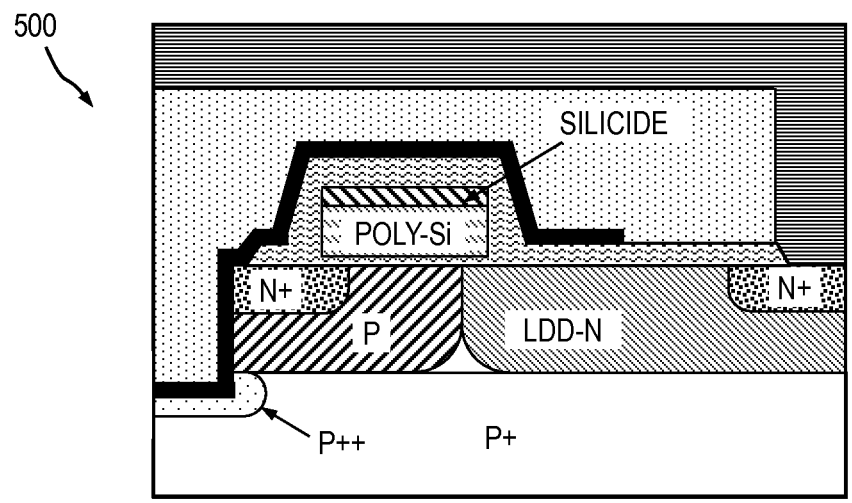
Figure 6:
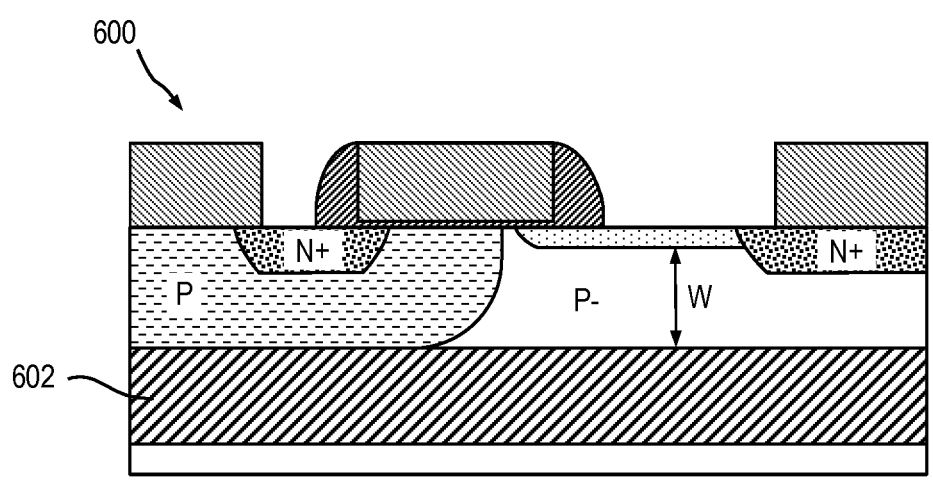
FIGS. 6 and 7 are cross-sectional views depicting conventional LDMOS transistor devices formed on SOI substrates.
Figure 7:
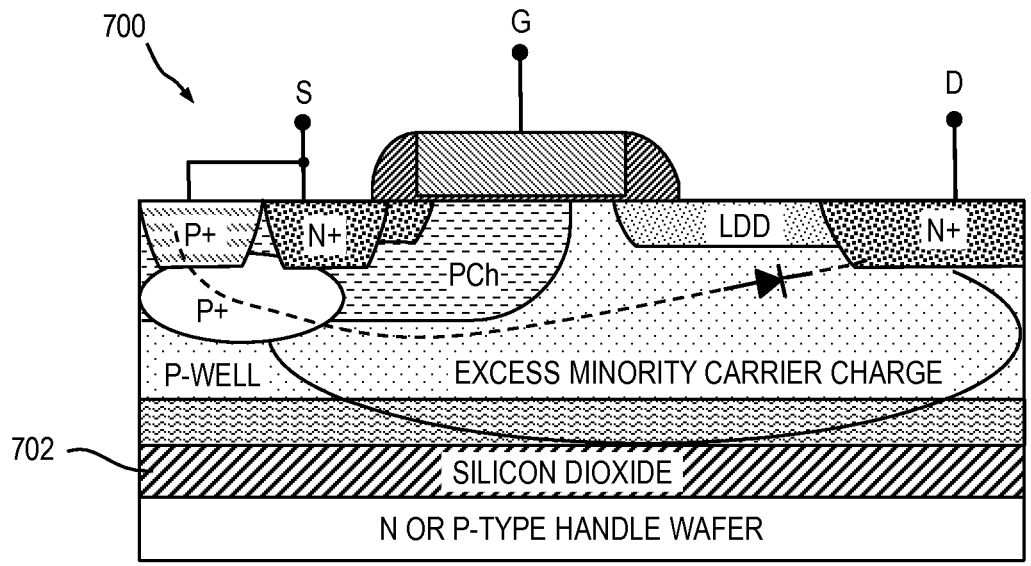

It is known that the switching performance of power MOSFETs can be drastically improved by reducing internal capacitances and the charge stored in an internal body diode (see, e.g., U.S. Pat. Nos. 7,420,247 and 7,842,568). FIGS. 4 and 5 are cross-sectional views depicting discrete laterally diffused metal-oxide-semiconductor (LDMOS) transistors 400 and 500, respectively, known in the art. The design of a power MOSFET on a silicon-on-insulator (SOI) substrate often provides a significant technical advantage in the performance of the MOSFET. FIGS. 6 and 7 are cross-sectional views depicting LDMOS transistors 600 and 700, respectively, formed on SOI substrates that are known in the art. Buried oxide beneath an active SOI layer (e.g., 602 in FIGS. 6 and 702 in FIG. 7) lowers output capacitance ($C_{oss}$) and strongly reduces a body diode volume, thereby reducing a diode stored charge ($Q_{rr}$) and related power loss during commutation (i.e., reversing bias across the transistor), compared to standard device structures. Both features reduce associated switching losses and enable an increase in the operating frequency of the device. Despite these technical advantages of the use of SOI substrates, the proposed transistors have not been broadly adapted for manufacturing of discrete and/or integrated power MOSFETs due to the increased cost of the product. Also, acceptance of this approach is impeded by problems with the long term reliability of the gate oxide at the gate side corner of the gate due to hot carrier injection (HCI) under avalanche condition.

Thus, there is a need to develop an analog integration process focused on optimal switching performance of lateral power devices, which allows a monolithic integration of different types of power switches along with the associated driving stages and, optionally, some monitoring and protection functions. Power stages manufactured in accordance with aspects of the invention provide an enhanced power management solution for an input voltage range between about one volt and about ten volts (V), and an output current between about one ampere and about five amperes. Accordingly, the delivered power will cover a range roughly between three watts and 30 watts, although embodiments of the invention are not limited to this or any specific power range.

As will be explained in further detail below, embodiments of the invention described herein are based on a 20-volt BiCMOS technology implemented on SOI substrates with dielectric lateral isolation. The system partitioning presented in FIG. 3 is achieved as a two-die solution, according to embodiments of the invention. A chip-scale assembly (i.e., chip-scale package (CSP) or wafer-level packaging (WLP)) is preferred to avoid volume and cost associated with packaging of individual components. In embodiments of the invention, the higher cost of the power switches is leveraged by a lower cost of integrated drivers, and a strong reduction in volume and cost of filter components is achieved by an increase in operating frequency.

Figure 8:
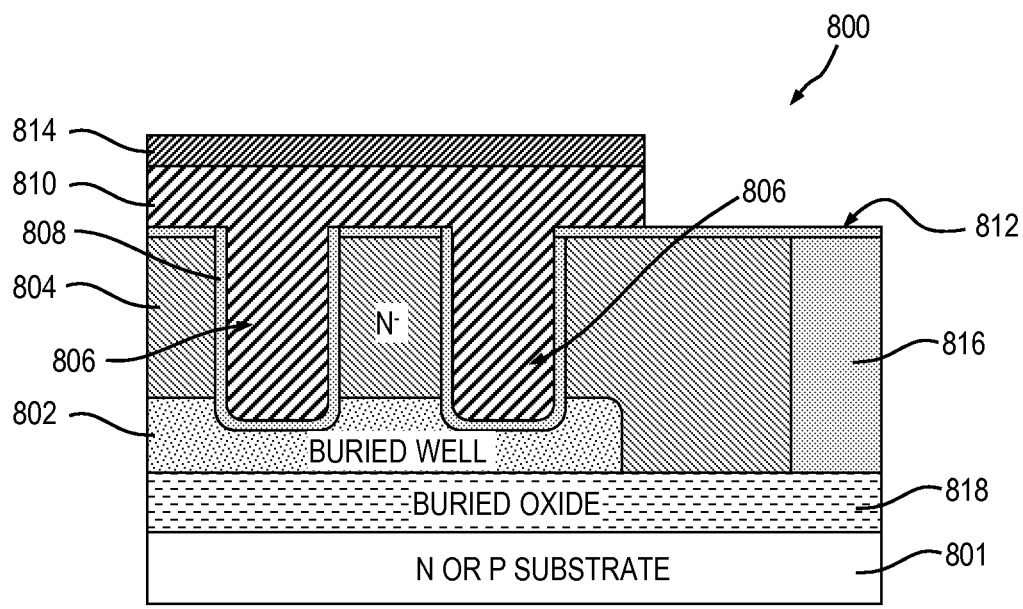
FIG. 8 is a cross-sectional view depicting at least a portion of an exemplary BiCMOS structure, according to an embodiment of the invention.

FIG. 8 is a cross-sectional view depicting at least a portion of an exemplary structure 800 which incorporates aspects according to an embodiment of the invention. The structure 800 may be fabricated using a BiCMOS process technology on an N-type or P-type substrate 801. With reference to FIG. 8, the structure 800 includes a combination of a buried well 802 which is locally implanted at the bottom of an active layer 804 and a plurality of trenches (i.e., trench stripes) 806 having sidewalls and bottom walls lined with gate oxide 808, or an alternative dielectric, and filled with polysilicon material 810, or an alternative conductive material. Trenches 806 are preferably formed as a group of parallel stripes which, when properly biased, affect a current flow therebetween (e.g., in the case of a FET or Schottky diode embodiment), or which function to increase a capacitance per area of the structure (e.g., in the case of a capacitor embodiment). In this example, the active layer 804 is formed as an $N^-$ region and the buried well 802 is formed as a $P^+$ well, although other embodiments may utilize an alternative doping scheme (e.g., $N^-$ region and $N^+$ buried well, or $P^-$ region and $P^+$ or $N^+$ buried well), as will become apparent to those skilled in the art given the teachings herein.

The configuration of structure 800 beneficially allows integration of a variety of components, such as, for example, FETs, BJTs, PN diodes, Schottky diodes, resistors and capacitors. Each of the trenches 806 extends substantially vertically from a top surface 812 of the structure 800, through the active layer 804, and at least partially into the buried well 802. In alternative embodiments, the trenches 806 may extend through the buried well 802, into the buried oxide layer 818. The oxide lining 808 covering the sidewalls and bottom walls of the trenches 806 prevents direct electrical connection between the polysilicon material 810 filling the trenches and the buried well 802. Polysilicon fill 810 is preferably used as a gate terminal which can be biased as in, for example, FET and Schottky diode embodiments.

The buried well 802 has an important function in devices operative to sustain an applied blocking voltage, such as transistors or diodes. More particularly, a doping level, doping type and/or a location of the buried well 802 are configured in a manner which substantially pins (i.e., clamps) a breakdown voltage at the PN junction created between an upper right side (i.e., tip) of the buried well and an $N^-$ background doping of the active layer 804. By selectively controlling one or more characteristics of the buried well 802, an electric field distribution in the device is controlled.

The trench stripes 806 having walls (i.e., sidewalls and bottom walls) lined with gate oxide 808 are placed between main terminals of the power devices formed therein. The term "main terminals" as used herein is intended to broadly refer to external connections to the device, such as, for example, source and drain terminals, in the case of an MOS device, or anode and cathode terminals, in the case of a diode. The trench gates stripes 806 are formed (e.g., etched) substantially in parallel to a current path in the illustrative embodiment shown in FIG. 8. As a result, a conduction current flows in the $N^-$ active layer 804 between the gate trenches 806 and can be controlled (e.g., modulated) by an applied gate potential, in the case of, for example, a lateral Schottky diode. In the case of a FET structure formed in accordance with one or more embodiments of the invention, the trench gates 806 are operative to deplete or enhance a gate/body interface, controlling the current flow through an inversion channel formed in the device.

Doped polysilicon material 810 filling the trenches is used to create a gate bus connecting the gate regions to a gate terminal in a third dimension (not explicitly shown). For an NFET device formed according to an embodiment of the invention, the polysilicon material 810 is preferably doped with phosphorous, with a doping concentration of greater than about $10^{19}/\text{cm}^3$, while for a PFET device, the polysilicon material is preferably doped with boron having a doping concentration of about $10^{19}/\text{cm}^3$. The top surface of polysilicon gate layer 810 is shown optionally covered by a layer of silicide material 814 (e.g., titanium silicide (TiSi) or tungsten silicide (WSi)) with low resistivity, which can be deposited thereon using a known silicide deposition process (e.g., chemical vapor deposition (CVD), sputter deposition, etc.). The silicide layer 814, which forms a polycide electrode in the device 800, reduces a gate resistance of the device.

In a preferred embodiment, narrow gate trenches 806 are formed underneath the polycide electrode 814 along a path of current flow in the body region 804. In this manner, the trenches 806 increase an effective gate width in the MOSFET structure 800, among other advantages.

Another trench structure 816, formed deeper than trenches 806, is preferably used to create a lateral isolation region between integrated components. The deep trench structure 816, also referred to herein as a lateral isolation trench, can be formed, for example, by etching from the top surface 812 of the structure, through the active layer 804, to a buried oxide layer 818 formed on the substrate 801. The lateral isolation trench 816 can be filled with oxide, or a combination of oxide and polysilicon. An optional deep trench cut (i.e., etch), not explicitly shown, through the buried oxide layer 818 to the substrate 801 can be used as a substrate contact. This optional trench is preferably filled with doped polysilicon, or an alternative conductive material, to ensure good ohmic (i.e., low resistance) contact to the substrate 801.

A variety of electronic components can be created using an illustrative BiCMOS process flow, according to embodiments of the invention. Examples of some components which can be formed which incorporate aspects of the invention are described herein below with reference to FIGS. 9A through 19.

Figure 9A:
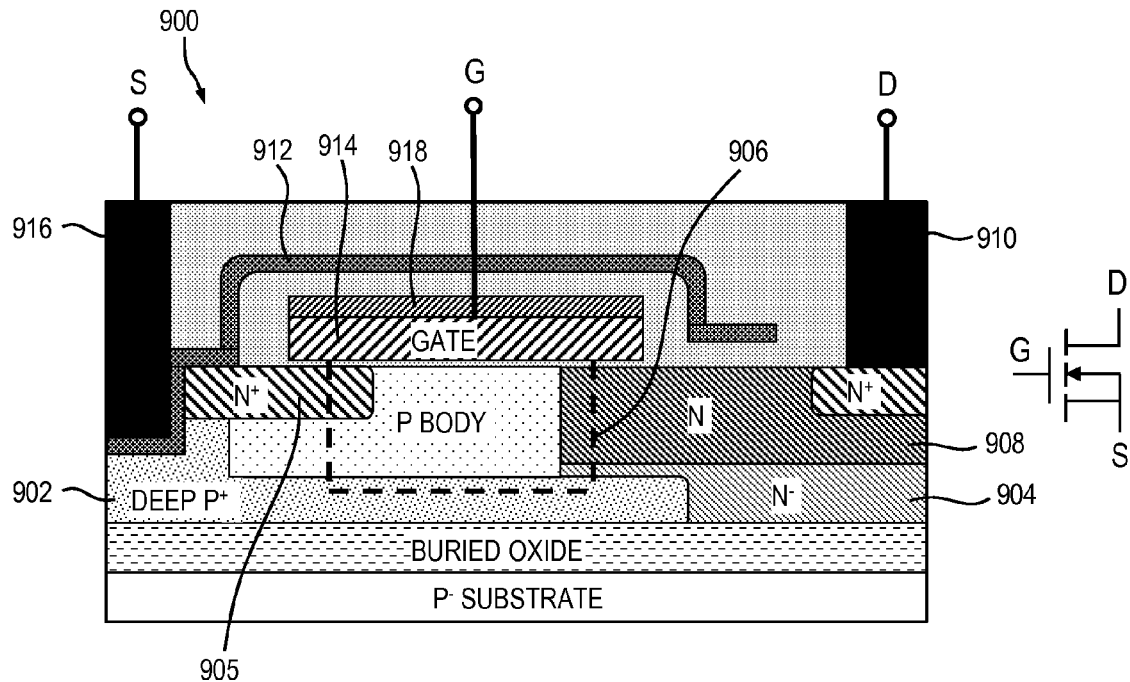
FIGS. 9A and 9B are cross-sectional views depicting at least a portion of an exemplary N-channel LDMOS transistor, according to an embodiment of the invention.
Figure 9B:
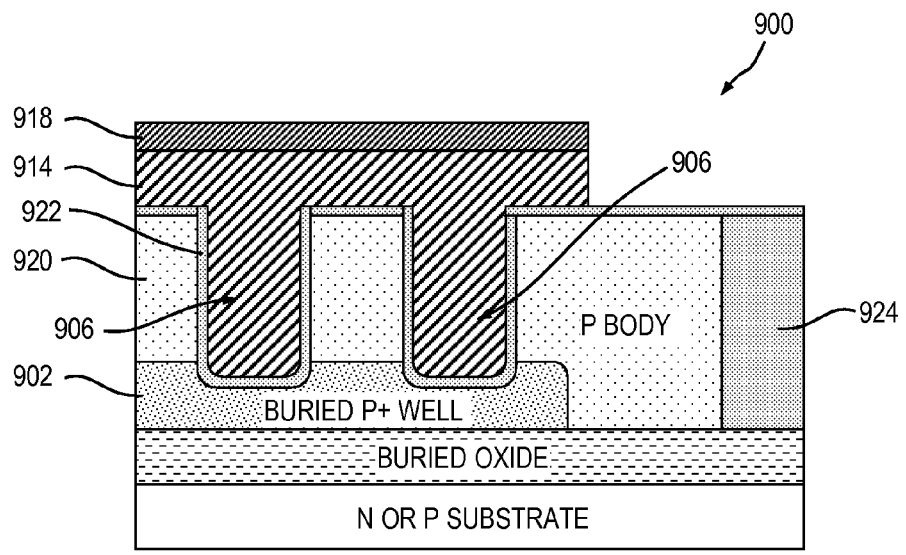

FIG. 9A is a cross-sectional view depicting at least a portion of an exemplary N-channel LDMOS transistor 900, according to an embodiment of the invention. The LDMOS transistor 900 has reduced gate-to-drain capacitance ($C_{gd}$) in comparison to standard LDMOS devices, due at least in part to the effect of the gate shield layer. Moreover, LDMOS transistor 900 shows a small impact of the reverse recovery of the body diode ($Q_{rr}$) due at least in part to reduced diode stored charge. Transistor 900 includes an integrated PN clamping diode (i.e., a diode formed by the end of the deep well 902 and the drain region) as an integral part of each active cell that pins the avalanche breakdown away from the gate oxide and close to the upper right corner of a buried P+ well 902. That is, under blocking condition, the avalanche impact ionization is localized between the tip of the buried well 902 and the corner of the drain contact region, within the volume of the active layer and away from the top and bottom oxide interfaces. This increases the avalanche ruggedness of the power transistor without causing any reliability issues. This transistor design minimizes the injection of hot carriers into oxides, improving the long term reliability of the power switch. A conduction current flows from a source region 905 between walls of a trench gate 906 into a lightly doped drain (LDD) extension region 908 into a drain contact 910. An alternative view of a similarly-formed trench gate (with the cross-section taken through the trench) is shown as structure 906 depicted in FIG. 9B. FIG. 9B illustrates the trench gate 906 formed substantially vertically through a P-type body region 920 and into the buried P+ well 902 formed at the bottom of the body region. The trench gate 906 has walls (i.e., sidewalls and bottom walls) lined with gate oxide 922. Also shown in FIG. 9B is a lateral isolation structure 924, which may be formed in manner consistent with the lateral isolation structure 816 shown in FIG. 8, that provides isolation between integrated components. During processing, a P− handle wafer in SOI substrate gets depleted along a P− substrate/buried oxide interface, which reduces an output capacitance, $C_{oss}$, of the MOSFET.

It is to be appreciated that, in the case of a simple MOS device, because the MOS device is symmetrical in nature, and thus bidirectional, the assignment of source and drain designations in the MOS device is essentially arbitrary. Therefore, the source and drain regions may be referred to generally as first and second source/drain regions, respectively, where "source/drain" in this context denotes a source region or a drain region. In an LDMOS device, which is generally not bidirectional, such source and drain designations may not be arbitrarily assigned.

The buried well 902, like the buried well 802 shown in FIG. 8, has an important function, especially in devices operative to sustain an applied blocking voltage (e.g., transistors and diodes). More particularly, a doping level, doping type and/or a location of the buried well 902 are configured in a manner which substantially clamps the breakdown voltage at the PN junction formed between an upper right side of the buried well and an N− background doping of an active layer 904 in the device. By selectively controlling one or more characteristics of the buried well 902, an electric field distribution in the device is controlled. For instance, the device can be advantageously arranged such that a maximum electric field is distributed between the upper right corner of the buried well 902 and a right bottom corner of a drain contact region 910. When configured in this manner, a clamping PN diode is integrated within the device which keeps hot carriers, generated by avalanche impact ionization, far away from a top silicon/oxide interface. This feature increases an ability of the device to absorb avalanche energy without creating reliability issues in the device.

When the illustrative SOI LDMOS devices 600 and 700 shown in FIGS. 6 and 7, respectively, are pushed into avalanche, impact ionization will take place at a bottom corner of the gate covering a lightly doped drain (LDD) region in the device, and the injection of hot carriers into a gate oxide in the device will often result in reliability issues, as are known to those skilled in the art. For at least this reason, conventional LDMOS structures on SOI are not suitable for use as power switches. By providing an ability to clamp the avalanche at a desired location in an LDMOS transistor device, the LDMOS structure formed in accordance with one or more aspects of the invention is well-suited for use in a power switching application.

With continued reference to FIGS. 9A and 9B, LDMOS transistor 900 includes a shield field plate 912, or alternative shielding structure, which, in this embodiment, is formed as a lateral extension of a conductive layer lining the source trench contact walls, overlaps a gate (e.g., polysilicon structure) 914 and comes into close proximity with an oxide interface along the N drain extension region (i.e., LDD region) 908. The conductive layer is preferably deposited as a titanium (Ti)/ titanium nitride (TiN) stack, but may be also formed of other materials, such as, for example, a titanium (Ti)/tungsten silicide (WSi) film. In this illustrative embodiment, the source trench is formed on the left-hand side of the LDMOS transistor 900, having side walls and a bottom wall lined with gate shield layer 912 and filled with top metal.

The shield 912 functions primarily as a field plate, distributing (e.g., stretching) an electric field distribution along a top oxide interface away from an edge (e.g., bottom right corner) of the gate 914 nearest the drain, and also as a shield that helps to reduce gate-to-drain capacitance, $C_{gd}$ (so called Miller capacitance, which determines the switching speed of the transistor), at a positive bias of the drain and further improves gate oxide reliability. The electric field peak appearing at the drain side corner of the gate 914 is now split between the gate corner and the end of the field plate, reducing the electric field peak value and inhibiting early injection of hot carriers into the oxide. Drain and source contacts 910 and 916, respectively, are formed as metal-filled vias reaching a patterned top metal layer (not explicitly shown, but implied) and form drain (D) and source (S) terminals, respectively, of the LDMOS device 900. Depleting the lightly doped drain extension region (908) also at a positive bias applied to the drain contact 910 also helps reduce $C_{gd}$. A silicide layer 918 formed on the polysilicon gate structure 914, thereby forming a polycide layer (also referred to as silicided polysilicon), is used to create a gate bus leading to a gate terminal (G) located in a third dimension (not explicitly shown, but implied). The silicide layer 918 is preferably formed using a known deposition process (e.g., CVD, sputtering, etc.).

Figure 10:
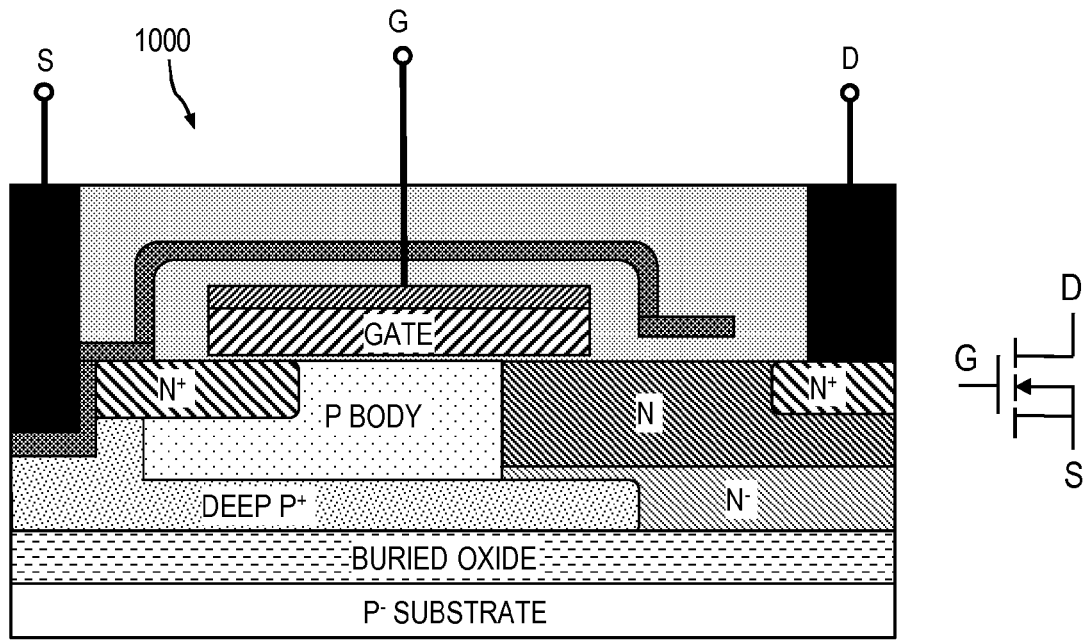
FIG. 10 is a cross-sectional view depicting at least a portion of an exemplary N-channel LDMOS transistor, according to another embodiment of the invention.

FIG. 10 is a cross-sectional view depicting at least a portion of an exemplary N-channel LDMOS transistor 1000, according to another embodiment of the invention. This LDMOS transistor 1000 is designed as a simplification of the LDMOS device 900 shown in FIGS. 9A and 9B. As apparent from FIG. 10, one simplification in the fabrication of LDMOS device 1000, compared to LDMOS device 900 shown in FIGS. 9A and 9B, comprises removal of the gate trenches (906 in FIGS. 9A and 9B). A primary impact on the performance of the MOSFET 1000 is a smaller gate width per unit area, which increases on-resistance, $R_{ON}$, of the resulting device. This can be leveraged by making the channel length shorter, as the alignment restriction related to an overlap of the gate polysilicon over gate trench endings is removed. Other features and characteristics of the MOSFET device 1000 remain essentially the same as for LDMOS device 900.

Figure 10A:
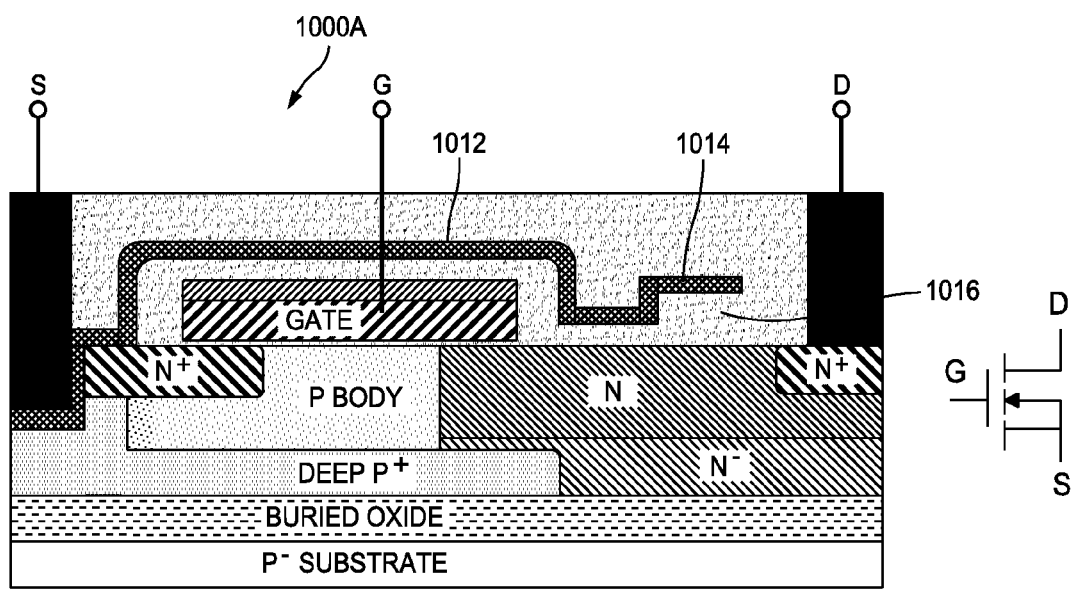
FIG. 10A is a cross-sectional view depicting at least a portion of an exemplary N-channel LDMOS transistor, according to another embodiment of the invention.

FIG. 10A illustrates an alternative embodiment of the LDMOS device 1000 of FIG. 10. Specifically, this embodiment includes a modification to extend the breakdown voltage above 20V. In the LDMOS device 1000A of FIG. 10A, a narrow stripe of thicker oxide 1016 is introduced between the gate and the drain terminals. This allows the gate shield 1012 to form a two-step field plate (i.e., raised step portion 1014 is added), which further improves the electric field distribution.

Figure 22A:
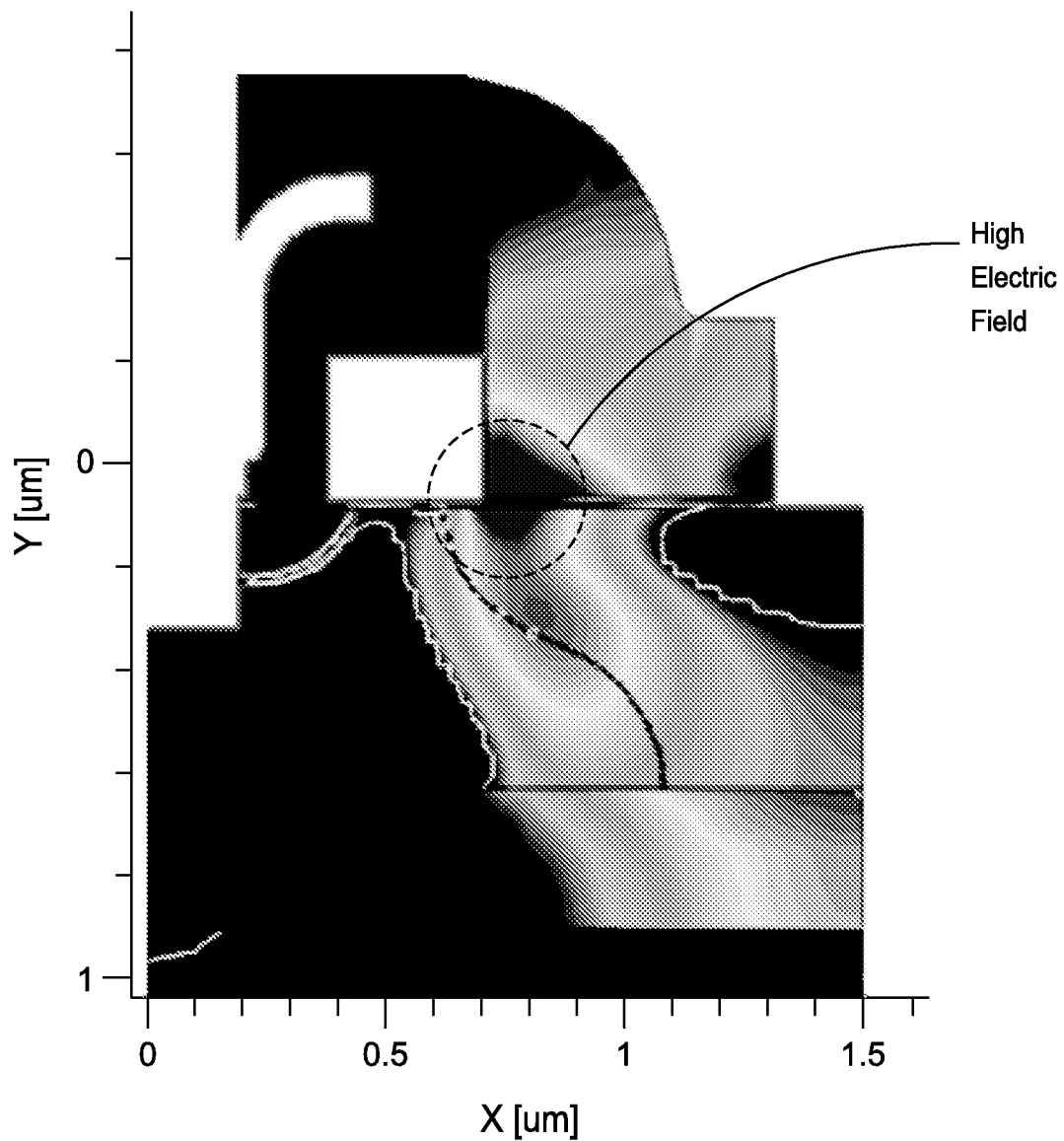
FIGS. 22A-22C illustrate the electric field distribution between gate and drain regions for various shielding structures.
Figure 22B:
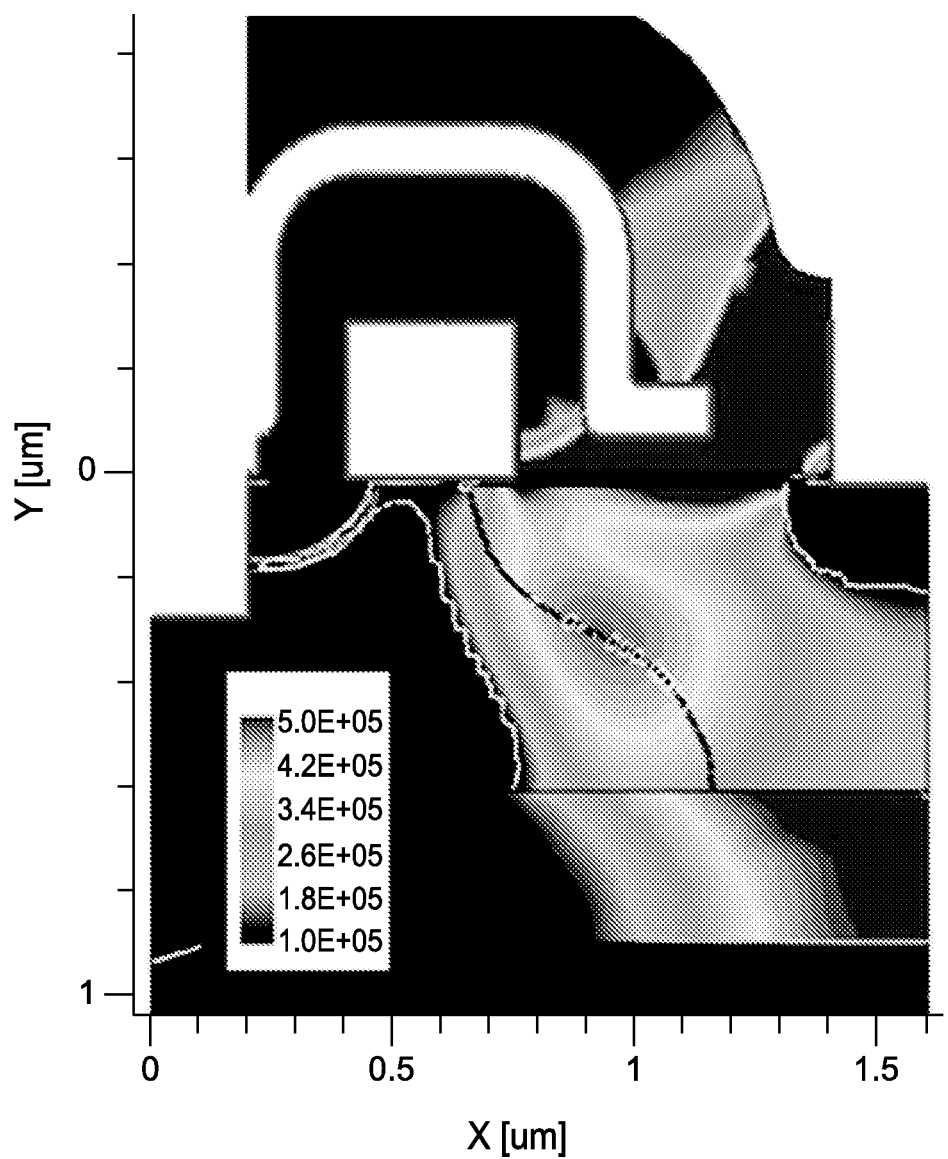
Figure 22C:
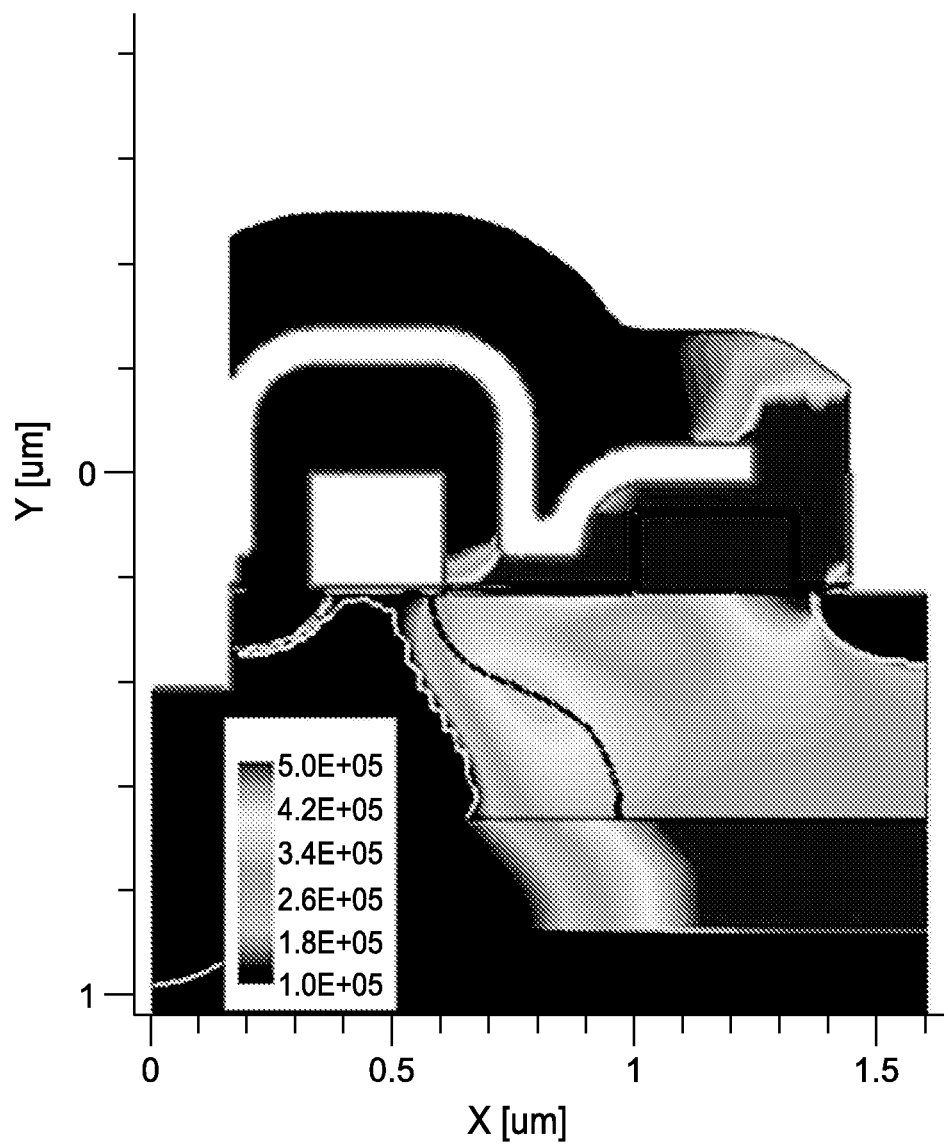

FIGS. 22A-22C show the electric field distribution between gate and drain regions in various configurations. FIG. 22A shows the electric field distribution between gate and drain regions without the effect of the field plate. The high electric field peak at the corner of the gate allows the injection of hot carriers into the gate oxide, which reduces the reliability of the transistor. FIG. 22B shows that the field plate formed by the gate shield layer, in a transistor designed for 20V breakdown, eliminates this critical electric field. Further improvement of the field plate in the shielding structure is shown in FIG. 22C where the introduction of a thicker oxide stripe enables a two-step field plate contour that pushes the peak electric field away from the gate corner. As noted above, this structure is preferably used in transistors designed for a breakdown voltage higher than 20V.

Figure 11:
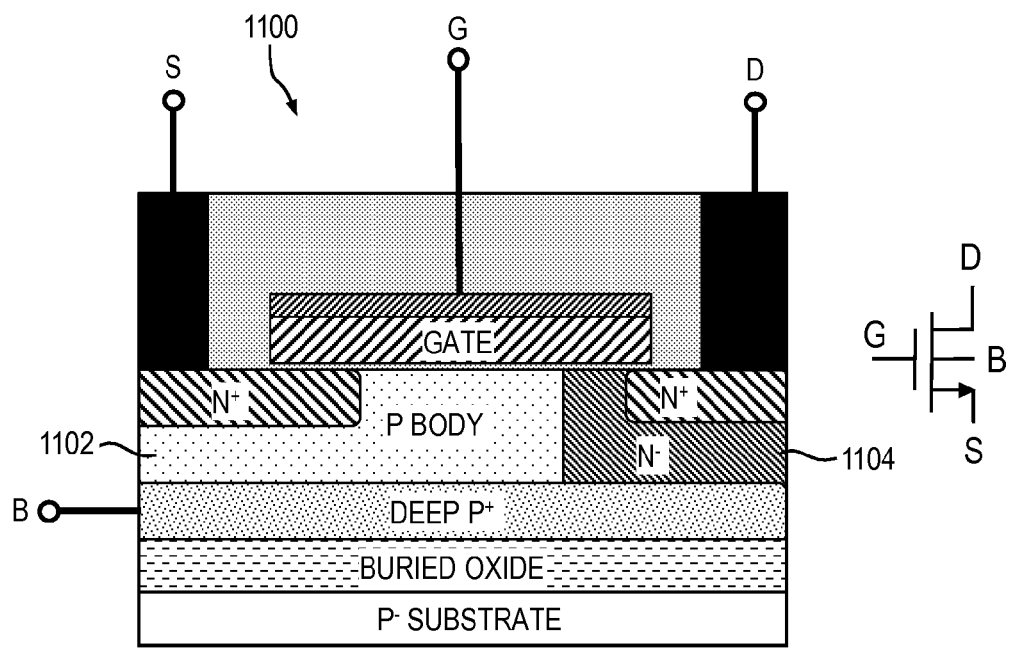
FIG. 11 is a cross-sectional view depicting at least a portion of an exemplary low voltage signal MOSFET, according to an embodiment of the invention.

FIG. 11 is a cross-sectional view depicting at least a portion of an exemplary low voltage signal MOSFET 1100, according to an embodiment of the invention. The MOSFET 1100 includes a P body region 1102 and an N drain region 1104, which can be used to form other circuit components, as will be described in further detail below. In this embodiment, the P$^+$ buried well is not directly connected with the source terminal, as it is in the exemplary MOSFET 1000 shown in FIG. 10, but rather is connected with a separate bulk (B) terminal. This configuration allows a voltage potential to be applied to the buried well that is different from the voltage potential applied to the source terminal. The MOSFET 1100 is formed by a further simplification of the illustrative device 1000 shown in FIG. 10. Specifically, a pitch of the basic cell has been reduced, thereby allowing a higher density of such devices to be placed in the circuit. As a trade-off for higher density, MOSFET 1100 has reduced high-voltage capability and reduced avalanche ruggedness, but these features are generally more important for power switching applications.

In certain embodiments of the MOSFET described above in connection with FIGS. 9A to 11, the transistor is designed to a target breakdown voltage specification between 12V and 60V. These MOSFETs are optimized for application as power switches with minimized conduction and switching power losses in low voltage power management systems. The embodiments described herein enable an increase of the switching frequency of DC/DC converters from 1.5 MHz to 5 MHz while implementing the integrated scheme of FIG. 3.

Figure 12A:
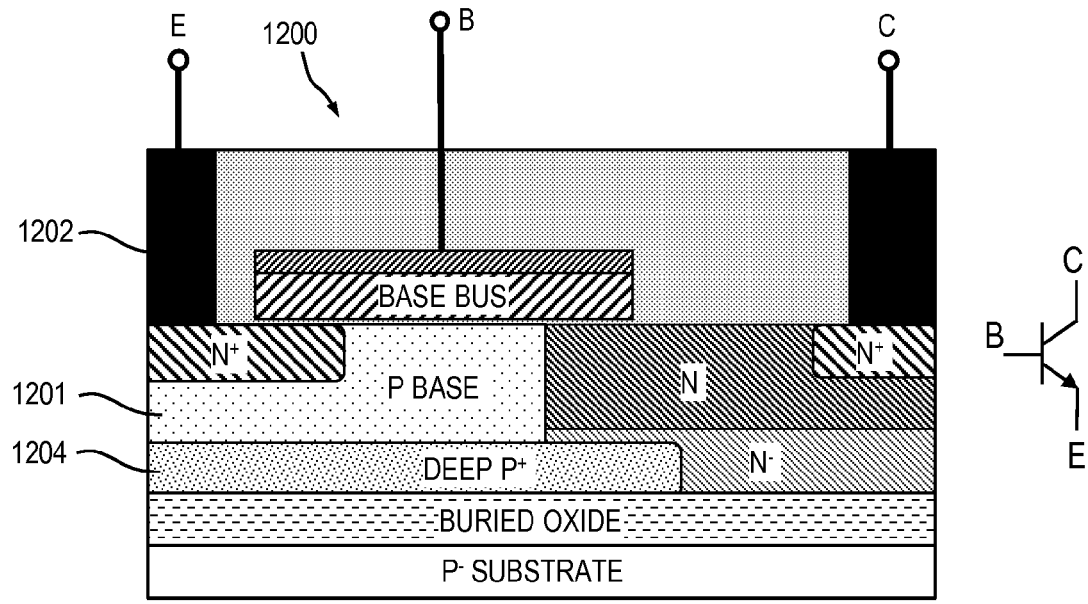
FIGS. 12A to 12E are cross-sectional views depicting at least a portion of an exemplary bipolar junction transistor (BJT), according to embodiments of the invention.
Figure 12B:
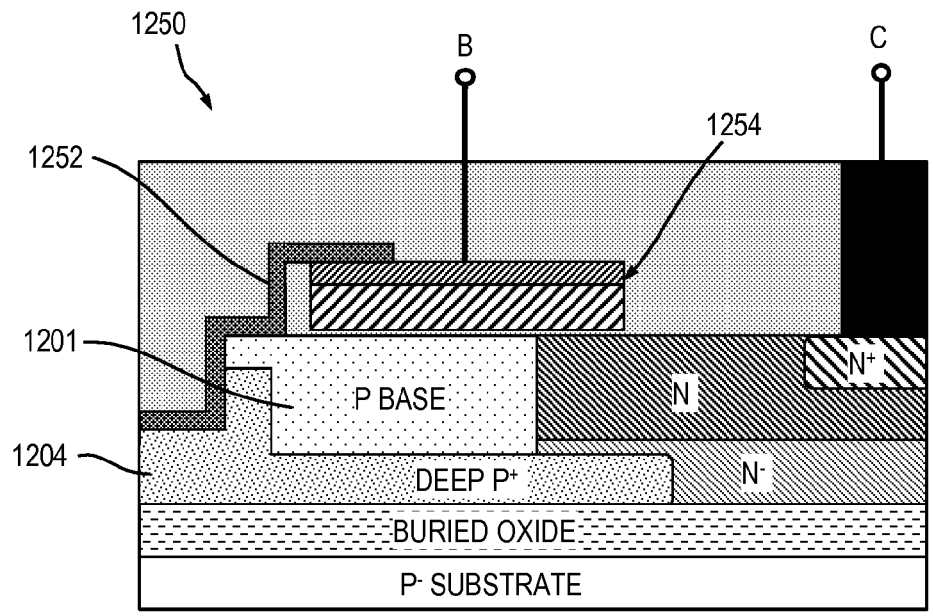

With reference now to FIG. 12A, a cross-sectional view depicts at least a portion of an exemplary SOI bipolar junction transistor (BJT) 1200, according to an embodiment of the invention. BJT 1200 is formed as a modification of the MOSFET device 1000 shown in FIG. 10. Here, a former body region 1102 of the MOSFET 1100 shown in FIG. 11 is used as a base region 1201 of the BJT 1200. The source trench contact has been removed. Instead, trench contacts 1202 are cut across the base region 1201 to make a connection between a deep P$^+$ layer 1204 and the polycide structure (i.e., silicided polysilicon). FIG. 12B depicts an exemplary BJT 1250 illustrating one way to form the connection between the deep P$^+$ layer 1204 and the polycide structure, according to an embodiment of the invention. Specifically, a connection 1252 between the deep P$^+$ layer 1204 and the polycide structure 1254 is formed as small spots (i.e., contacts) by interrupting the emitter contact 1202 (e.g., between fingers) along the finger layout. The connection 1252, in this embodiment, is formed as a lateral extension of the titanium (Ti)/titanium nitride (TiN) layer (in a manner similar to the field plate 912 shown in FIG. 9) and overlaps the polycide structure 1254. These contacts are preferably placed at prescribed intervals along the polycide stripe (e.g., the polycide region which, in the case of a MOSFET, would be the gate patterned as a stripe, and is used to build a base bus contact), and the polycide layer is used to create a base bus with low resistivity. Using the polycide material as the current bus contacting the base region to the base terminal assures low base resistance, which improves the switching performance of the transistor.

Figure 12C:
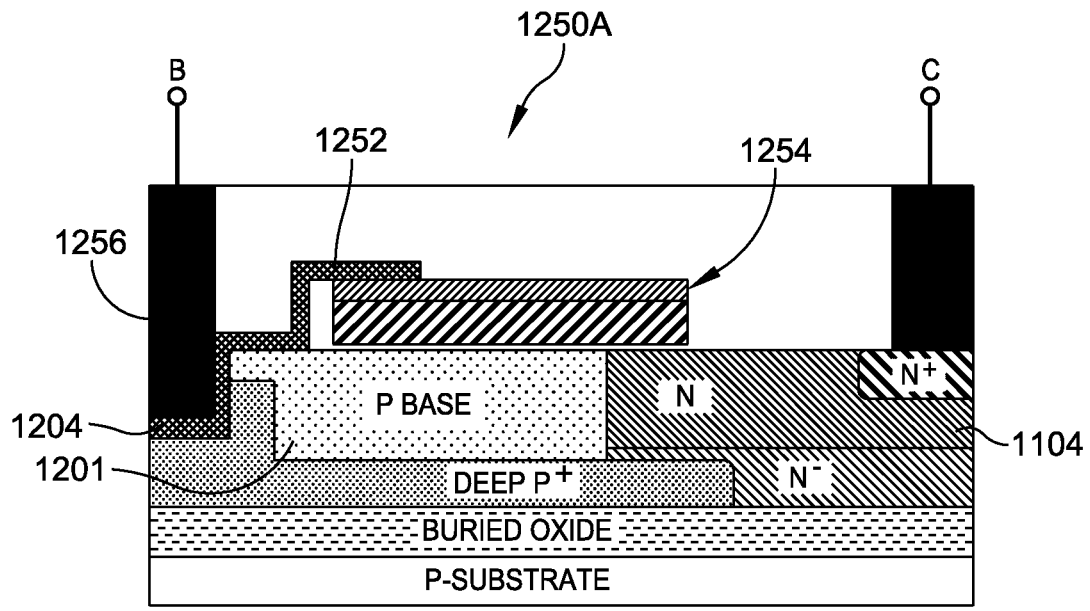

FIG. 12C illustrates a BJT embodiment 1250A where a base contact 1256 is formed partially in a trench region formed in the active region and in electrical contact with the connection 1252.

Figure 12D:
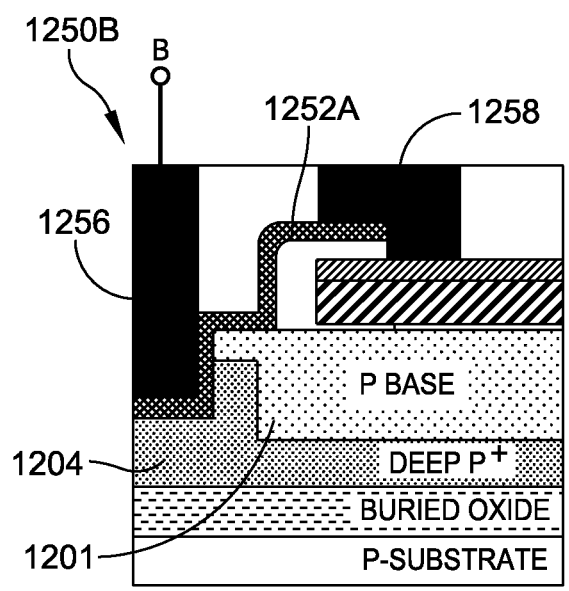

In an embodiment illustrated in the partial cross-sectional view of FIG. 12D, the connection 1252A does not directly contact the polycide base but rather is spaced therefrom. A button-like contact 1258 is provided and contacts both the upper surface of the polycide base and the upper surface (and optionally side surface) of connection layer 1252A. One or more of these button contacts 1304 can be spaced (in a third dimension along the base polycide stripe and interleaved with the emitter contact) to make contact between the polycide base structure with the deep P+ well 1204 and base contact 1256 via the connection layer 1252A.

The initial high-voltage capability and the avalanche ruggedness of the MOSFET structure are preserved using this BJT configuration. The PN junction created between the tip of the deep P+ well and the collector region acts as the clamping diode. As in the case of the MOSFET, the PN clamping diode of the BJT pins the area of the avalanche breakdown within the volume of the silicon layer, confining hot carriers generated by avalanche impact ionization to this location.

With reference to FIG. 12A, one can observe that the BJT includes a MOS channel underneath the polycide stack, which creates a MOSFET structure in parallel with the bipolar transistor. If the positive bias applied to the BJT-base terminal is larger than the threshold voltage of the MOSFET, then the collector current is increased by the electron current flowing through the MOS channel, which improves the gain ($\beta$) of the BJT.

Though not shown, a shield structure as discussed in connection with other embodiments described herein may also be incorporated into this design to improve the breakdown/reliability performance of the BJT device.

Figure 12E:
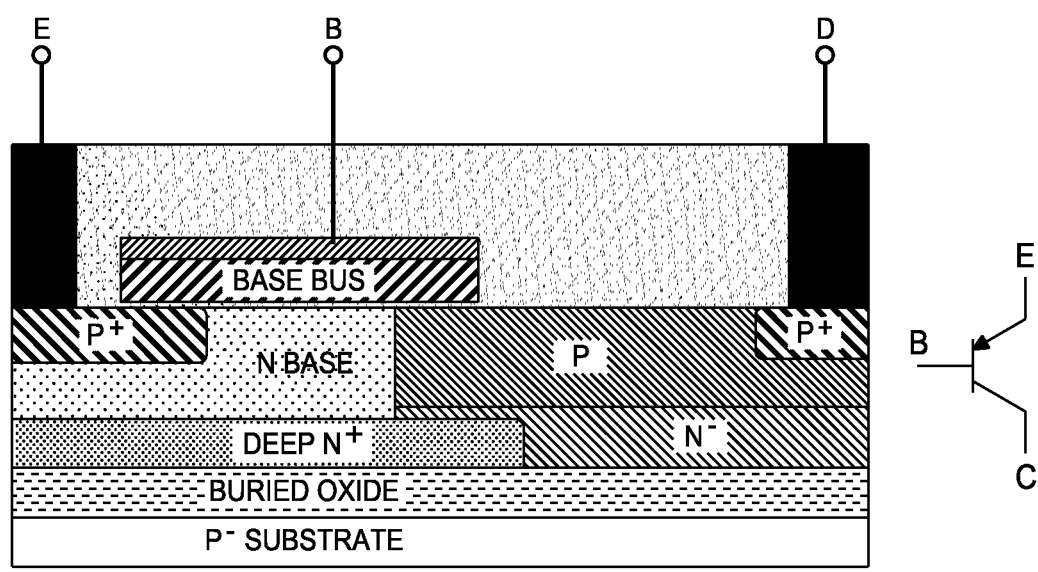

As shown in FIG. 12E, the NPN BJT transistor structure shown in FIG. 12A can be converted into a PNP BJT by reversing the polarity of the implanted dopant regions.

As noted above, the basic MOSFET structure can be adapted to provide power diodes. Unlike conventional power PN diodes designed in a VLSI technology, the power PN diodes described herein exhibit avalanche ruggedness. Moreover, the basic MOSFET structure can be adapted to provide Schottky diodes, which are typically not in the designer's VLSI component toolbox. The structure disclosed herein increases the flexibility of the power management IC design by implementation of PN and Schottky diodes able to sustain the full supplied voltage. These diodes exhibit unique avalanche ruggedness when voltage spikes in the supply voltage rail drive the circuit beyond the allowed maximum blocking voltage value. These proposed diodes are compatible with the process flow disclosed for the SOI-MOSFETs and are straightforward modifications of that structure.

Figure 13:
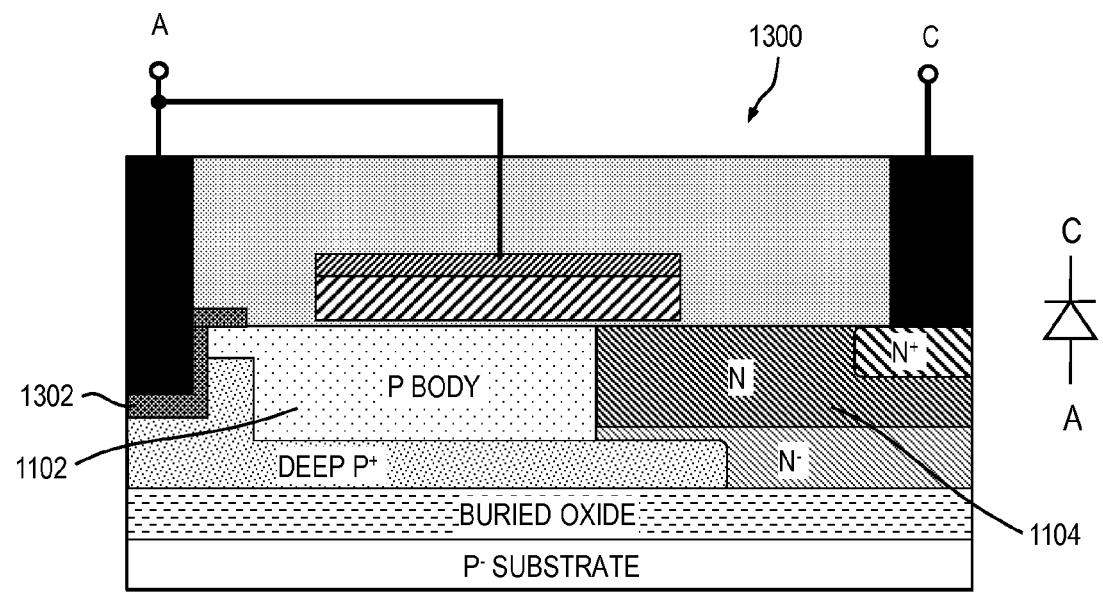
FIG. 13 is a cross-sectional view depicting at least a portion of an exemplary PN diode, according to an embodiment of the invention.

FIG. 13 is a cross-sectional view depicting at least a portion of an exemplary PN diode 1300, according to an embodiment of the invention. The PN diode 1300 is obtained as a modification of the exemplary MOSFET structure 1000 shown in FIG. 10. Here, the N+ source region has been omitted, and the PN junction used to form the diode 1300 is created by a junction of the former P body 1102 and N drain 1104. An anode (A) terminal is formed having a trench contact 1302 adapted for electrical connection with the P body 1102. A cathode (C) terminal is adapted to provide electrical connection with N region 1104 of the diode. The initial high-voltage capability and the avalanche ruggedness of the MOSFET structure are preserved.

Figure 13A:
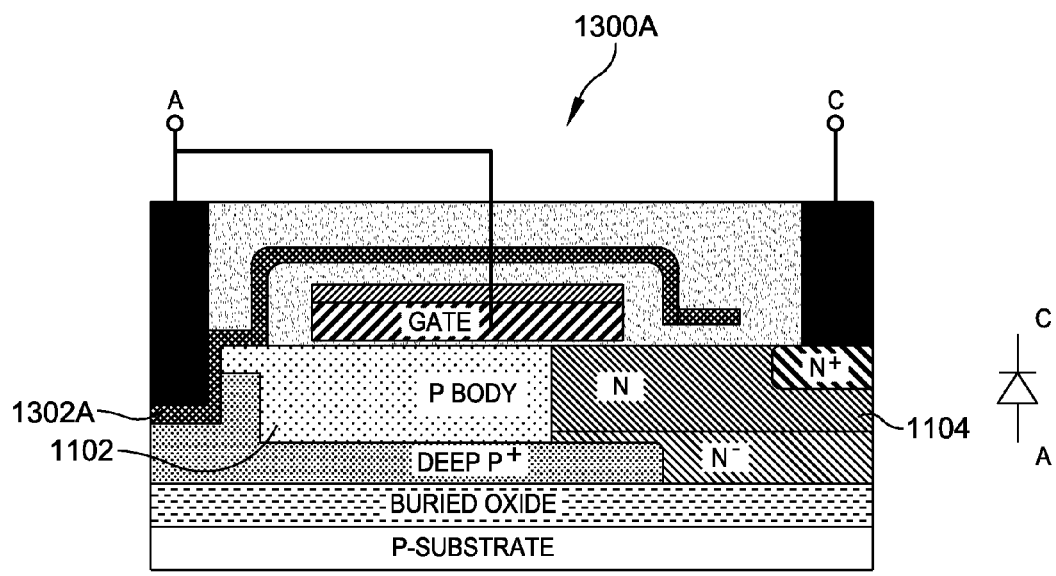
FIG. 13A is a cross-sectional view depicting at least a portion of another embodiment of an exemplary PN diode.

FIG. 13A is a cross-sectional view depicting at least a portion of an exemplary embodiment of a PN diode 1300A, according to an alternative embodiment. The PN diode 1300A is identical to the PN diode 1300 except for the modified trench contact 1302A, which extends to at least partially overlap the gate to provide a shielding structure including a field plate, as described above in connection with FIGS. 9A and 10. The PN diode of FIG. 13A preserves the full voltage blocking capability of the LDMOS structure by the presence of the deep P+ well 1102 placed along the active layer interface to the buried oxide. Under blocking condition, the avalanche impact ionization is localized between the tip of the buried well 1102 and the corner of the cathode contact region, within the volume of the active layer and away from top and bottom oxide interfaces. This design of the diode minimizes the injection of hot carriers into oxides improving the long term reliability of the power device. The PN junction, which is created by the end of the deep P+ well 1102 and the cathode region, acts as a clamping diode as an integral part of each active cell of the diode. The avalanche breakdown defined by this clamping diode is pinned within the volume of the Silicon material increasing the avalanche ruggedness of the power device. The integrated shielding structure reduces the capacitive coupling between the gate and cathode terminals and serves as a field plate stretching out the electric field distribution along the top oxide interface with the Ldd region. The electric field peak appearing at the cathode side corner of the gate stack is now split between the gate corner and the end of the field plate, reducing the electric field peak value and inhibiting early injection of hot carriers into the oxide.

Figures 13B, 13C:
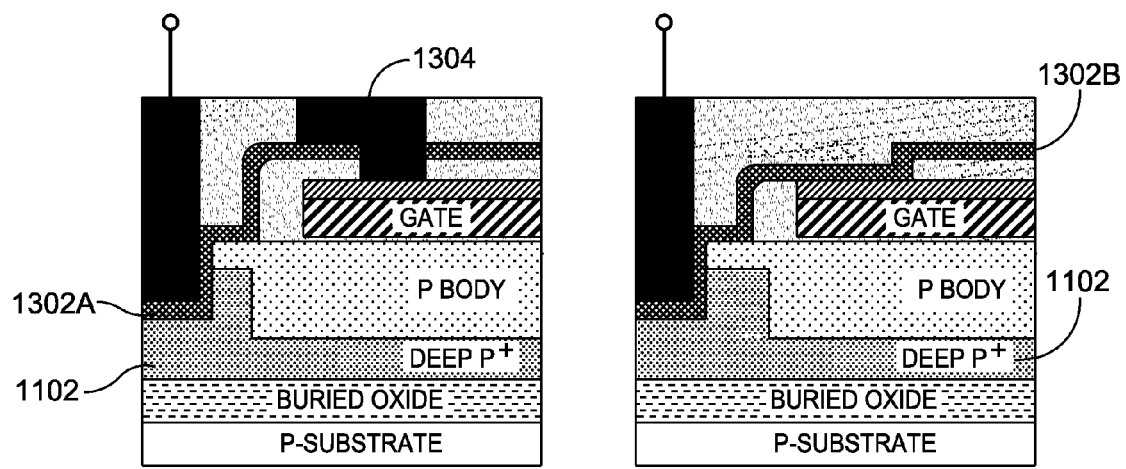
FIGS. 13B and 13C are cross-sectional views depicting approaches to coupling the gate to the anode terminal according to embodiments of a PN diode.

In the embodiments of FIGS. 13 and 13A, the polycide gate and the deep P+ well 1102 can be connected to the anode terminal in a third dimension. As shown in the partial cross-sectional view of FIG. 13B, the polycide gate can be connected to the anode and deep P+ well 1102 via a button-like contact 1304 extending through the conductive layer/gate shield 1302a that makes electrical contact with both the polycide of the gate structure and with the conductive layer/gate shield 1302a (e.g., by being formed partly on the top surface of the conductive layer 1302a). One or more of these button contacts 1304 can be spaced (in a third dimension) to make contact to the gate polycide in prescribed intervals (e.g., in a finger layout) along the polycide stripe rather than interrupting the shielding structure 1302A with a continuous contact. FIG. 13C illustrates an alternative approach to coupling the gate polycide to the anode and deep P+ well. Specifically, the anode trench contact 1302B has a lateral extension that (like the extension shown in FIG. 12B) that extends to connect the gate polycide to the anode and deep P+ well 1102. This extension 1302B also extends to form the shielding structure with field plate as described above in connection with the embodiment FIG. 13B. In another embodiment, the gate bus can be configured as a terminal separate from the anode, and the two can be shorted together externally. This approach may provide for simpler processing in some embodiments.

Monolithic integration of Schottky diodes has been observed for power MOSFETs where the Schottky diode clamps the integral body diode. This approach is aimed at avoiding power losses related to the stored charge Qrr during commutation of the drain-to-source bias of the power MOSFET. In the approach of U.S. Pat. Nos. 6,049,108 and 6,078,090, a Schottky diode is integrated within a trench-MOSFET structure where the proximity of two trench walls below the Schottky contact is used to shield the Schottky contact interface from a high electric field induced by the drain voltage under blocking condition. The advantage of this TMBS structure (Trench-MOS-Barrier-Schottky) is that the electrical shield of the Schottky contact enables the use of the higher doping of the semiconductor (lower Vf) without any deterioration of the blocking capability. Also, the leakage current of a TMBS diode has flat voltage characteristics up to the breakdown voltage defined by the PN junction present in a neighbor cell.

U.S. Pat. No. 7,745,846 discloses a Schottky diode integrated as a dedicated cell in an LDMOS transistor structure.

The structure has a vertical current flow towards the drain contact at the back side of the wafer. The electrical shielding of the Schottky contact formed between the top metal and the LDD-1 region is achieved by the blocking impact of the gate and P-buffer regions. The forward I-V characteristics of the Schottky diode can be influenced by the gate potential. The integrated Schottky diode has the same blocking voltage capability as the parent LDMOS transistor. No comparable Schottky diodes are proposed in the art for power management ICs.

Figure 14A:
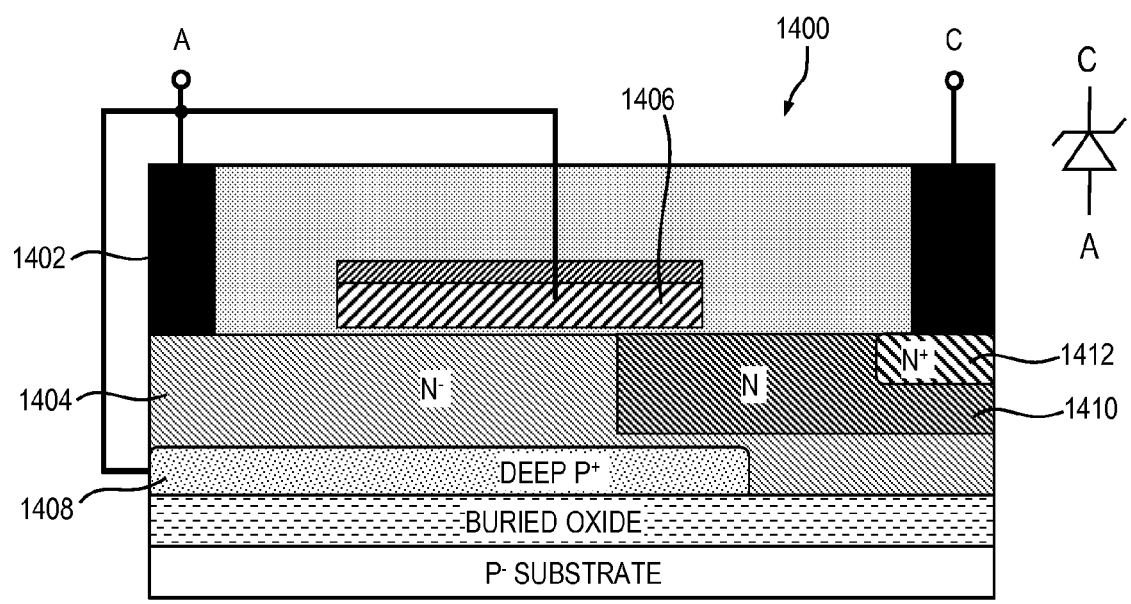
FIG. 14A is a cross-sectional view depicting at least a portion of an exemplary Schottky diode, according to an embodiment of the invention.

FIG. 14A is a cross-sectional view depicting at least a portion of an exemplary Schottky diode 1400, according to an embodiment of the invention. The Schottky diode 1400 is formed as a modification of the PN diode 1300 shown in FIG. 13. Specifically, the anode trench contact 1302 is omitted, along with the P body region 1102 (see FIG. 13), allowing a Schottky barrier to be created at an interface between the anode contact (metal) 1402 and an $N^-$ active layer 1404. In embodiments, the Schottky barrier is stabilized by a two-step rapid thermal annealing (RTP at 650° C. and 820° C.), which results in a formation of a silicide phase (e.g., $TiSi_2$) at the contact interface. The top polycide layer 1406 and deep $P^+$ well 1408 are electrically connected to the anode (A) terminal and induces a pinching of the electric field distribution under an applied blocking bias of the cathode (C) terminal. This pinching effect created by the placement of the gate stack at the top of the $N^-$ region and the deep $P^+$ well at the bottom of the $N^-$ region, which is similar to an action of a JFET channel, shields the Schottky contact interface against any high electric field under blocking conditions. The shielding effect keeps leakage current in the diode 1400 low in the full range of the blocking voltage (e.g., about 12 volts to about 20 volts, although the invention is not limited to any specific voltage or range of voltages). The value of the leakage current in the diode will be a function of doping characteristics of the $N^-$ active region 1404 at the Schottky contact, as will be known by those skilled in the art. (See, e.g., U.S. Pat. No. 5,365,102, the disclosure of which is incorporated by reference herein in its entirety). Shielding of the Schottky contact enables a higher doping of the semiconductor at the Schottky interface, as discussed below in connection with FIG. 14B, and improves the electrical performance of the diode.

The connection of the deep $P^+$ well 1408 and the polycide structure 1406 with the anode contact 1402 can be formed in a manner consistent with the connection 1252 shown in FIG. 12B for the illustrative BJT device 1250. Specifically, the connection between the deep $P^+$ layer 1408 and the polycide structure 1406 is preferably formed as small spots by interrupting the anode contact 1402 along a finger layout. The connection, in this embodiment, is formed as a lateral extension of the titanium (Ti)/titanium nitride (TiN) layer (not explicitly shown in FIG. 14A, but implied in a manner similar to the connection 1252 shown in FIG. 12B) and overlaps the polycide structure 1406. These contacts are preferably placed at prescribed intervals along the polycide stripe (e.g., the polycide region which, in the case of a MOSFET, would be the gate patterned as a stripe), and the polycide layer is used to create a low resistivity shielding structure which is operative to shield the Schottky contact against any high electric field under blocking conditions, as previously stated.

Figure 14B:
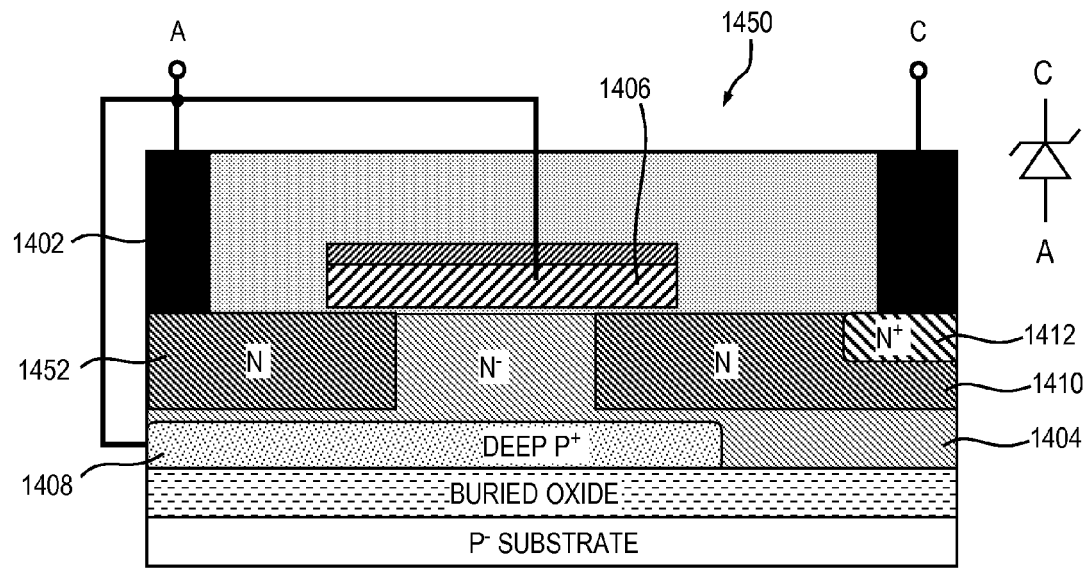
FIG. 14B is a cross-sectional view depicting at least a portion of an exemplary Schottky diode, according to another embodiment of the invention.
Figure 14C:
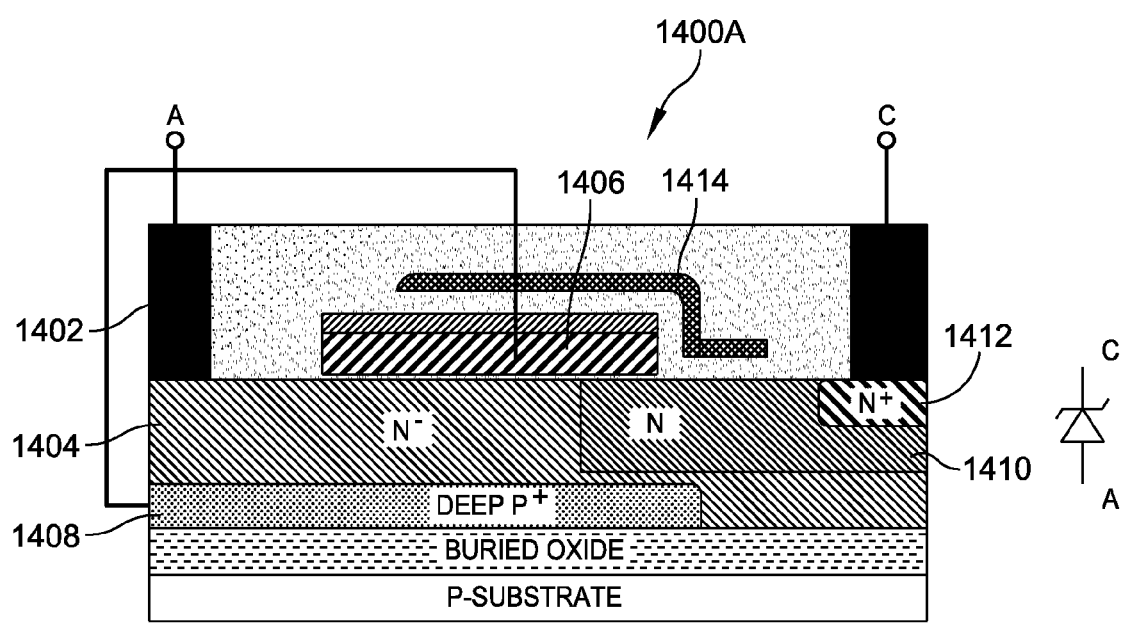
FIG. 14C is a cross-sectional view depicting at least a portion of an alternative embodiment of an exemplary Schottky diode.

FIG. 14C illustrates a cross-sectional view depicting at least a portion of an exemplary Schottky diode 1400A, according to an alternative embodiment. The Schottky diode 1400A is identical to the Schottky diode 1400 except for the inclusion of the shielding structure 1414, which serves as both a gate shield and a field plate for the Schottky diode 1400A. The connection of the deep $P^+$ well 1408 and the polycided gate structure 1406 with the anode contact 1402 can be formed in a manner consistent with the connection shown in FIG. 13B or 13C for the illustrative PN diode device 1300A, or external connections can be made as dictated by the process. In embodiments, the shielding structure 1414 can also be incorporated into the Schottky diode structure shown in FIG. 14B.

The initial high-voltage capability and the avalanche ruggedness of the MOSFET structure are preserved, as the blocking voltage is sustained by the device structure on the cathode (former drain) side of the top polycide electrode, and the avalanche breakdown is clamped by the PN junction at the upper right corner (i.e., tip) of the deep $P^+$ well 1408. The deep well 1408 is preferably an implanted well with a maximum doping concentration close to the Si/buried oxide interface. In a preferred embodiment, the maximum doping concentration is in the range of about $5e16\ cm^{-3}$ and $5e17\ cm^{-3}$, and the doping profile is configured to slope down towards the surface. It is to be appreciated, however, that the invention is not limited to a specific doping concentration or profile of the deep well 1408. The PN junction, in this embodiment, is formed by the deep $P^+$ well 1408, $N^-$ active layer 1404, N region 1410 and $N^+$ region 1412 toward the cathode terminal.

FIG. 14B is a cross-sectional view depicting at least a portion of an exemplary Schottky diode 1450, according to another embodiment of the invention. The Schottky diode 1450 is essentially the same as the Schottky diode 1400 depicted in FIG. 14A, except that an additional N region 1452 is formed in the $N^-$ active layer 1404, proximate an upper surface of the $N^-$ active layer, in a manner similar to N region 1410. An advantage of the Schottky diode 1450, compared to Schottky diode 1400 shown in FIG. 14A, is that the forward voltage drop of the Schottky diode 1400 depicted in FIG. 14A can be reduced by increasing the doping concentration of the $N^-$ active layer 1404 proximate the Schottky contact. In a preferred embodiment, this is achieved by extending the N implant region 1410 at the cathode side of the polysilicide region to the region under the anode (A) contact 1402, shown as N region 1452 in FIG. 14B.

As described herein above in conjunction with the exemplary structures depicted in FIGS. 10 through 14C, an important benefit according to one or more embodiments of the invention is the inclusion of the deep well which is configured to clamp the breakdown voltage away from the silicon/oxide interface. This arrangement advantageously enables the structure to absorb avalanche energy without experiencing reliability issues. Additional structures according to other embodiments of the invention incorporate a similar configuration of the drain region, thus inheriting the avalanche ruggedness of the parent MOSFET design shown, for example, in FIGS. 9A and 9B.

Figure 15:
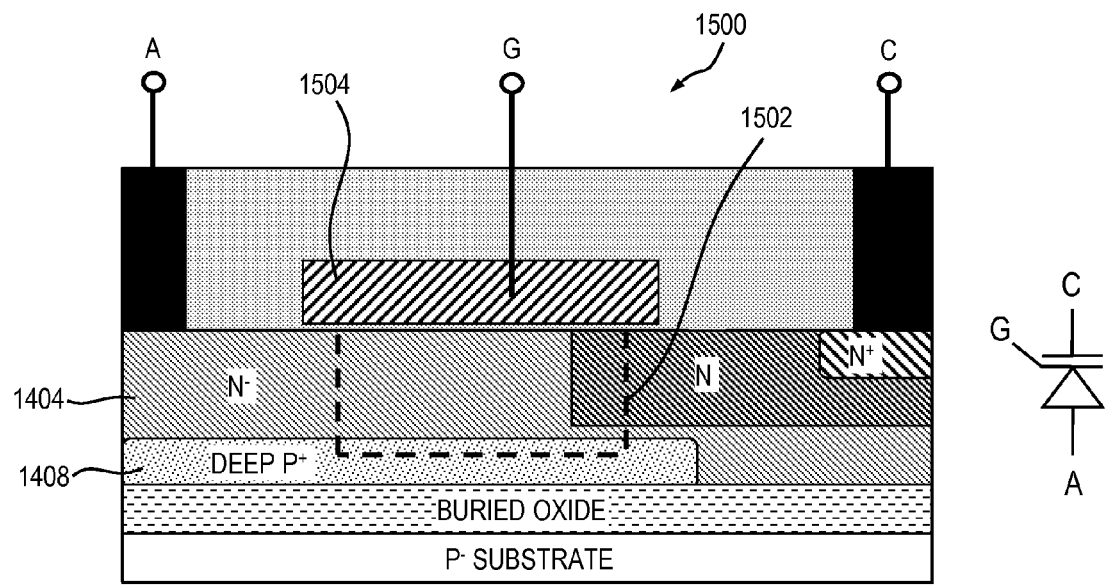
FIG. 15 is a cross-sectional view depicting at least a portion of an exemplary Schottky diode, according to a third embodiment of the invention.

FIG. 15 is a cross-sectional view depicting at least a portion of an exemplary Schottky diode 1500, according to another embodiment of the invention. Schottky diode 1500 is formed as a modification of the illustrative Schottky diode 1400 depicted in FIG. 14A. Specifically, in a manner consistent with the modification of the MOSFET 900 shown in FIG. 9, gate trenches 1502 are formed in the device, preferably along a current flow path in the $N^-$ mesa region (i.e., active layer) 1404 underneath a polycide electrode 1504 formed on an upper surface of the active layer of the diode 1500. The gate trench structure 1502 additionally improves the shielding effect of the Schottky contact against the blocking voltage applied to the cathode (C) terminal. In the Schottky diode 1500, the gate electrode is decoupled from an anode (A) terminal and can be used to further modify a conduction path between the gate trenches 1502. The anode terminal is connected to the deep P$^+$ well 1408 in a third dimension, which is not explicitly shown but is implied. The Schottky diode 1500 may be referred to herein as a switched Schottky diode and represents a new type of power device, according to an embodiment of the invention.

Figure 15A:
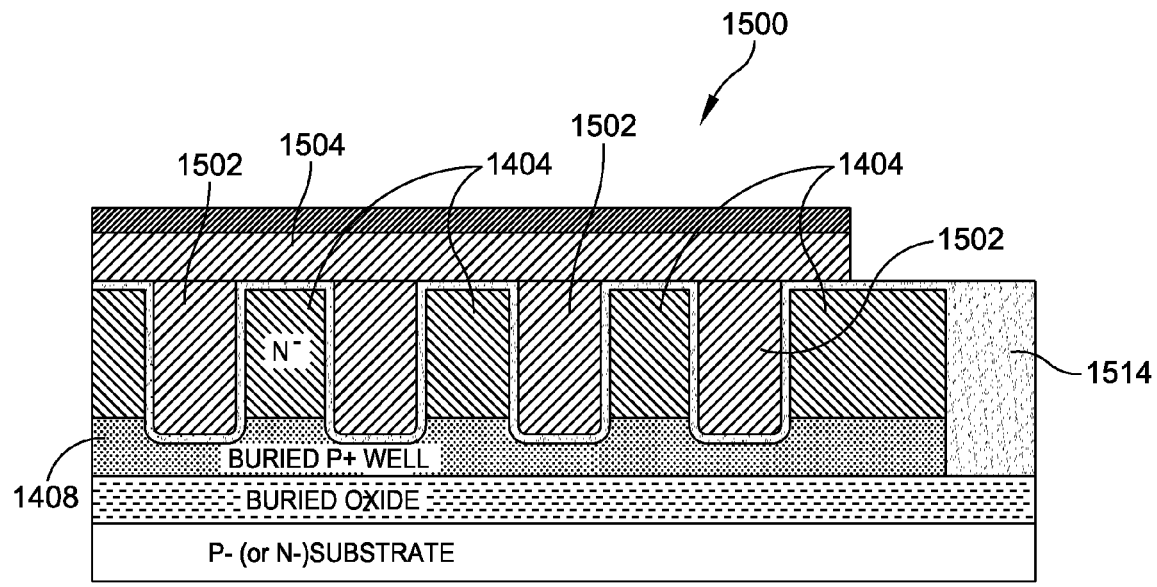
FIG. 15A is a cross-sectional view depicting the gate trench structure of FIG. 15.

FIG. 15A is a cross-sectional view depicting the trench structure of the switched Schottky diode device of FIG. 15 in more detail. The current flows under conduction condition between the gate trenches 1502 from the anode (source) contact to the cathode (drain) region. If the trench width is smaller than the width of the N$^-$ mesa region (i.e., active regions 1404) between the trenches 1502, then the effective gate width per active cell is increased. The increase of the gate width corresponds to an increase of the transconductance of the MOSFET, and respectively to a reduction of the on-resistance of the transistor. As shown in FIGS. 15 and 15A, the gate trenches are implemented in the SOI-Schottky diode structure to further intensify the shielding effect by combination of vertical and lateral depletion of the N$^-$ layer 1404. The gate region can be accessed as a third terminal to turn on and off the lateral depletion effect by applying a corresponding bias to this electrode. The anode terminal can be connected to the deep P$^+$ well 1408 in the third dimension as discussed above in connection with other embodiments. Lateral isolation regions 1514, which may comprise an oxide or other dielectric material, are formed in the diode structure 1500 to electrically isolate the diode from other circuit components on the die.

Figure 15B:
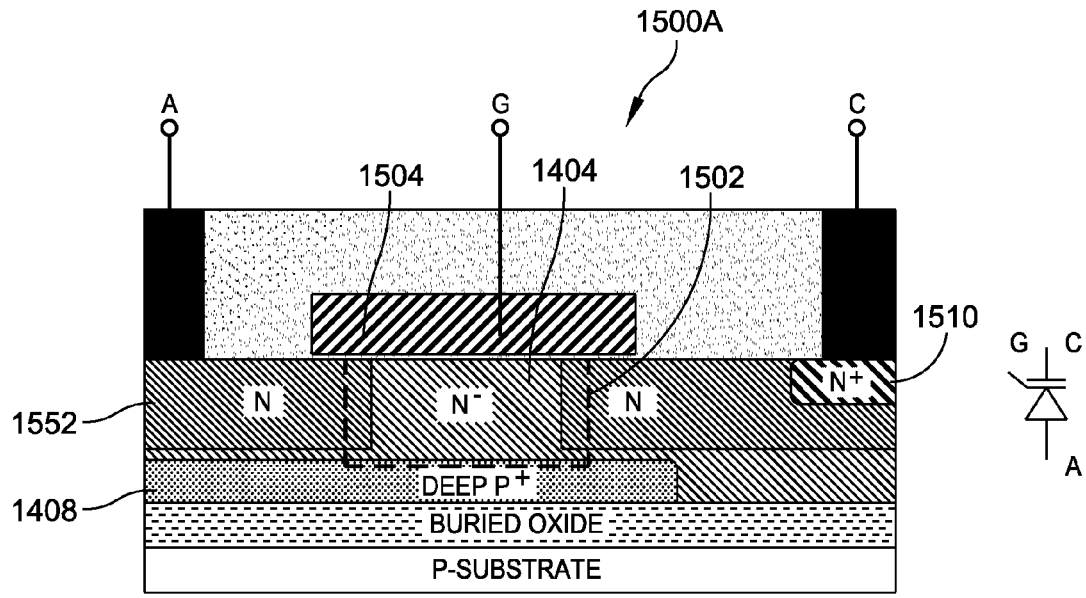
FIG. 15B is a cross-sectional view depicting at least a portion of another embodiment of an exemplary Schottky diode.
Figure 15C:
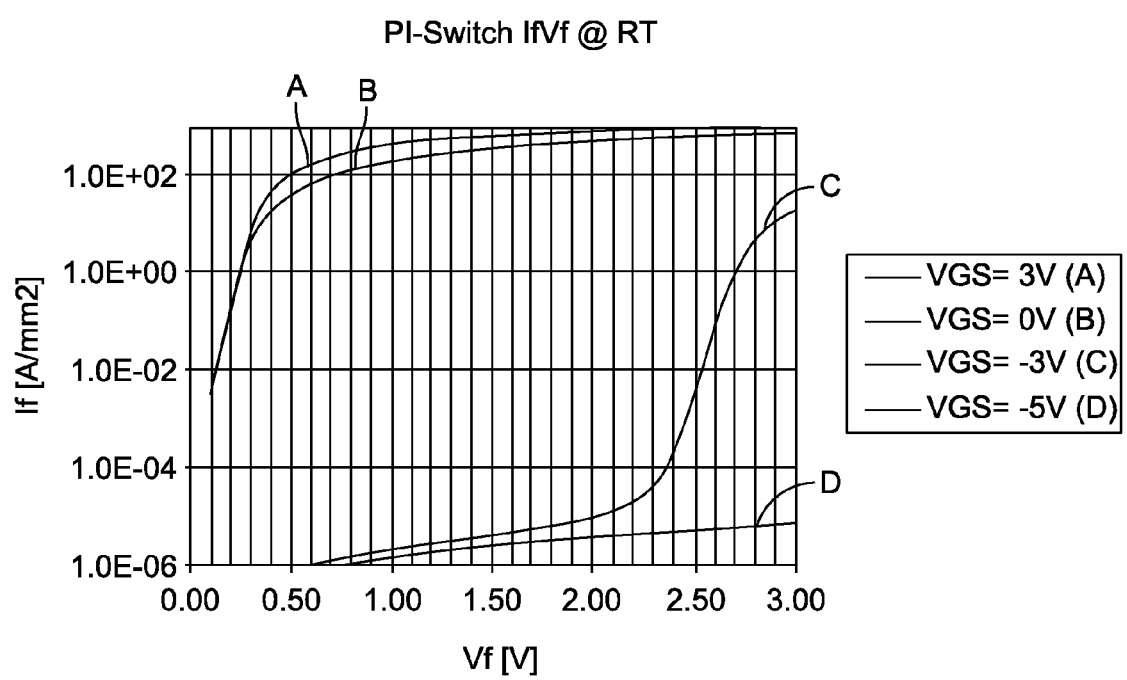
FIG. 15C is a graph illustrating a change of the conduction current for an embodiment of an exemplary Schottky diode.

FIG. 15B illustrates an alternative embodiment of a switched Schottky diode 1500A. The switched Schottky diode 1500A is essentially the same as the switched Schottky diode 1500 depicted in FIG. 15, except that an additional N implant region 1552 is formed in the N$^-$ active layer 1404, proximate an upper surface of the N$^-$ active layer, in a manner similar to N region 1510. That is, the active layer is doped to a higher N dopant concentration in the vicinity of the Schottky contact while keeping the doping of the active layer between the gate trenches 1502 at the original lower N$^-$ level. An advantage of the switched Schottky diode 1500A, compared to switched Schottky diode 1500 shown in FIG. 15, is that the forward voltage drop (Vf) of the Schottky diode 1500 depicted in FIG. 15 can be reduced by increasing the doping concentration of the N$^-$ active layer 1404 proximate the Schottky contact, and the shielding effect remains unaffected. In a preferred embodiment, this is achieved by extending the N implant region 1510 at the cathode side of the polysilicide region to the region under the anode (A) contact, shown as N region 1552 in FIG. 15B. While in known devices such as disclosed in U.S. Pat. No. 7,745,846, the forward characteristics could be modified by the gate-to-anode bias applied to the gate electrode, the diode structure from FIG. 15B exhibits a change of the conduction current by four orders of magnitude when turning on and off the gate bias, as illustrated in FIG. 15C. This switched Schottky diode may be called a π-Switch due to the gate trench structure cross-section illustrated by FIG. 15A. Though not shown, a gate shield structure as discussed in connection with other embodiment may also be incorporated into this design to improve the breakdown/reliability performance of the device.

Figure 16:
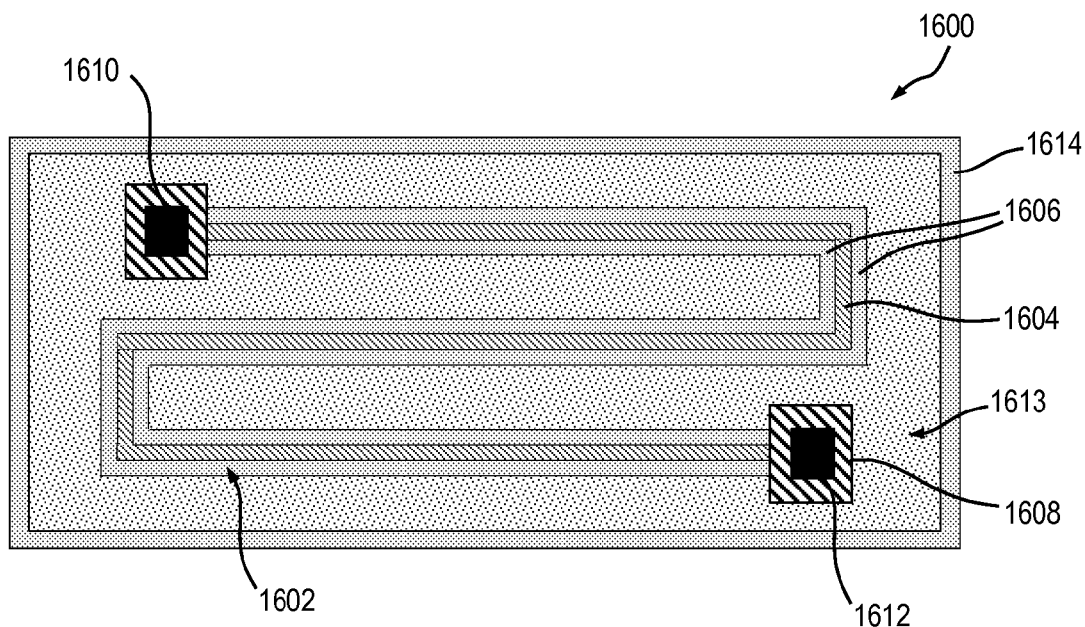
FIGS. 16 and 17 are top plan and cross-sectional views, respectively, depicting at least a portion of an exemplary resistor structure in a serpentine layout, according to an embodiment of the invention.
Figure 17:
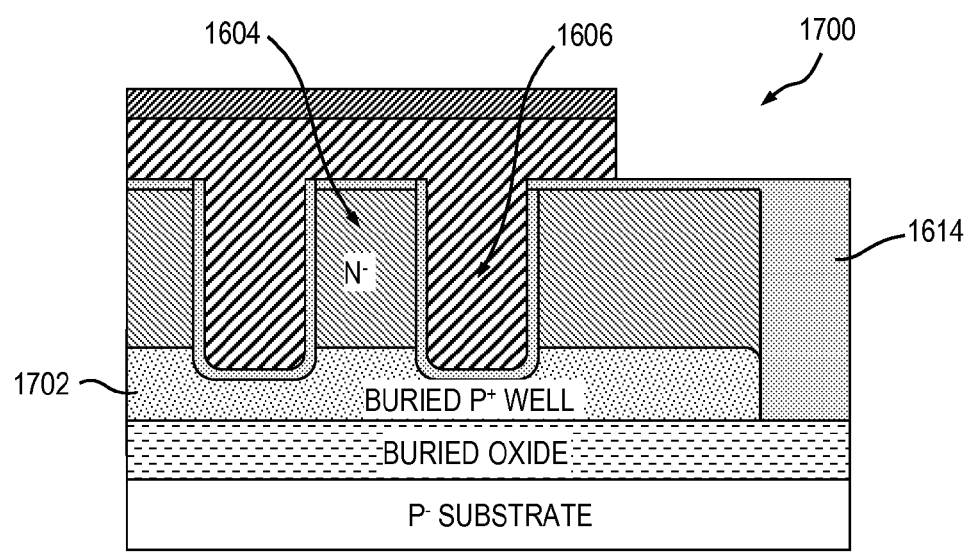

FIGS. 16 and 17 are top plan and cross-sectional views, respectively, depicting at least a portion of an exemplary resistor structure 1600 in a serpentine layout, according to an embodiment of the invention. The resistor path 1602 is defined by an N$^-$ region 1604 between gate trenches 1606, which is connected to N$^+$ contact regions 1608 and 1610 on both ends of the serpentine. One of the N$^+$ contact regions, e.g. 1608, includes a trench contact 1612 to a deep P$^+$ well 1603 (not explicitly shown in FIG. 16, but shown in FIG. 17 as well 1702). The P$^+$ well 1603 isolates the N$^-$ resistor path 1602 from a bottom, as shown in the cross-sectional view of FIG. 17. As shown in FIG. 17, buried P$^+$ deep well 1702 is operative to electrically isolate the resistor formed by the N$^-$ region between the trenches. Lateral isolation regions 1614, which may comprise an oxide or other dielectric material, are formed in the resistor structure 1600 to electrically isolate the resistor from other circuit components on the die.

Figure 18:
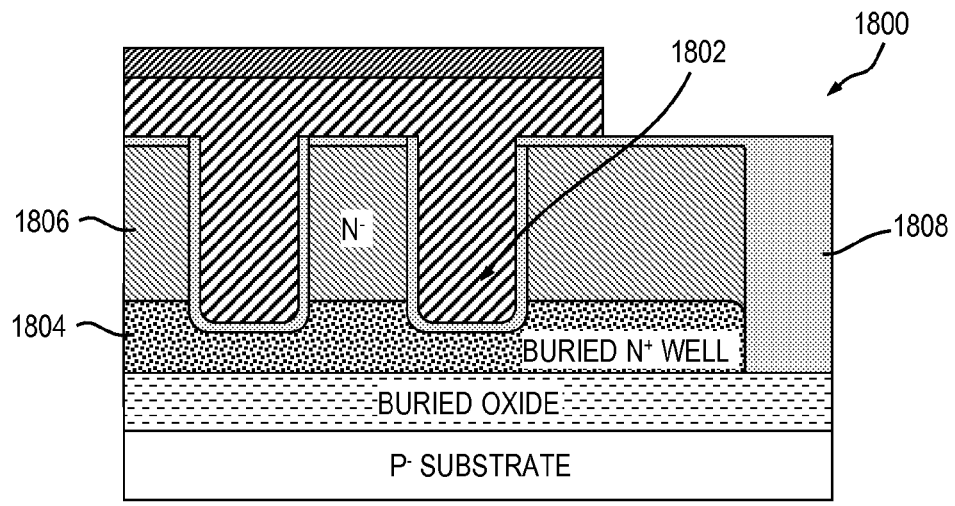
FIG. 18 is a cross-sectional view depicting at least a portion of an exemplary capacitor structure, according to an embodiment of the invention.

With reference now to FIG. 18, a cross-sectional view depicts at least a portion of an exemplary capacitor structure 1800, according to an embodiment of the invention. The capacitor structure 1800 can have a serpentine layout similar to the resistor structure 1600 shown in FIG. 16, or it may be comprise multiple parallel stripes formed by the trenches 1802. Capacitor electrodes 1802 are formed by the polysilicon fill in the gate trenches and by the deep N$^+$ well 1804 at the bottom of the active layer 1806. Both regions are connected to terminals at ends of the serpentine layout, not explicitly shown but implied. Lateral isolation regions 1808, which may comprise an oxide or other dielectric material, are formed in the capacitor structure 1800 to electrically isolate the capacitor from other circuit components on the die.

Figure 19:
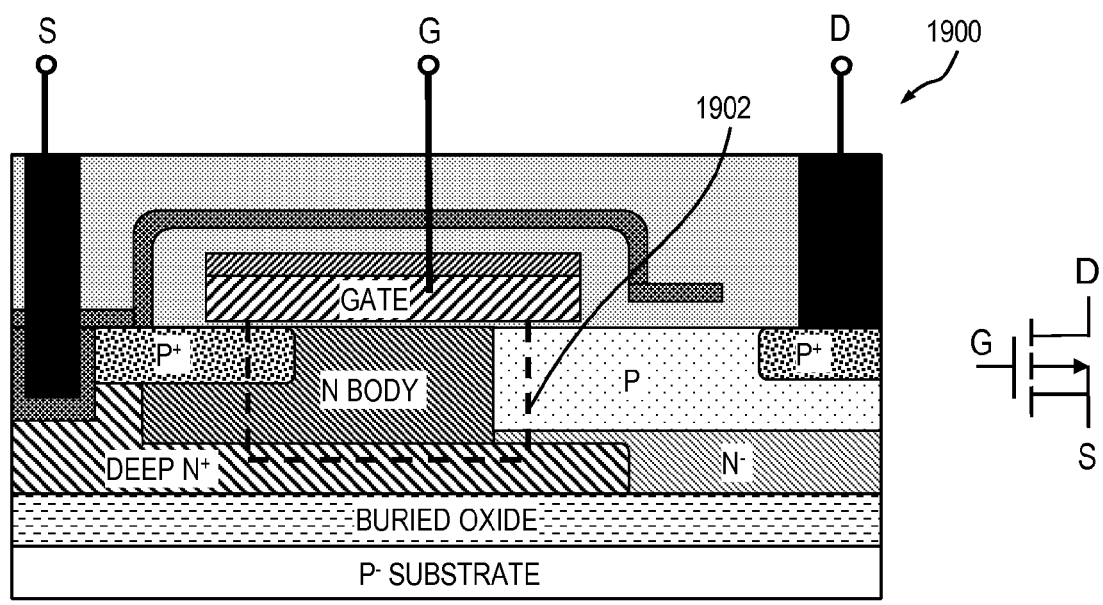
FIG. 19 is a cross-sectional view depicting at least a portion of an exemplary P-channel MOSFET, according to an embodiment of the invention.

FIG. 19 is a cross-sectional view depicting at least a portion of an exemplary P-channel MOSFET 1900, according to an embodiment of the invention. The MOSFET 1900 is formed as a modification of the N-channel MOSFET 900 shown in FIG. 9, wherein a polarity type of the material used to dope the body (P body in FIG. 9), as well as source and drain regions, have been reversed to create a P-channel LDMOS transistor. The implants dedicated to form a P-channel MOSFET in parallel to the N-channel transistor increases the mask count compared to the process used to make the N-channel LDMOS transistor 900 only, as will be known by those skilled in the art. As with the N-channel LDMOS transistor 1000, one simplification in the fabrication of LDMOS device 1900 comprises removal of the gate trenches 1902. A primary impact on the performance of the resultant MOSFET is a smaller gate width per unit area, which increases on-resistance, $R_{ON}$, of the resulting device. This can be leveraged by making the channel length shorter, as the alignment restriction related to an overlap of the gate polysilicon over gate trench endings is removed.

The exemplary electronic components depicted in FIGS. 9 through 19 can be used to build a BiCMOS circuit including power switches, diodes, and some associated circuitry. The BiCMOS process flow includes a basic mask set allowing manufacturing of components presented in FIGS. 9 through 17, and an additional mask subset allowing the component portfolio to include the structures shown in FIGS. 18 and 19. As used herein, the phrase "basic mask set" is defined broadly to refer to a minimum number of mask levels required to fabricate a set of devices based on an NFET structure according to embodiments of the invention.

Figure 20A:
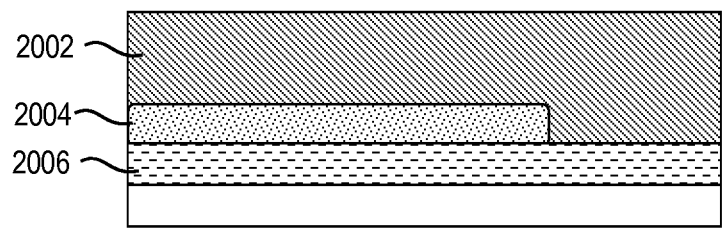
FIGS. 20A through 20F are cross-sectional views depicting an exemplary BiCMOS process flow, according to an embodiment of the invention.
Figure 20B:
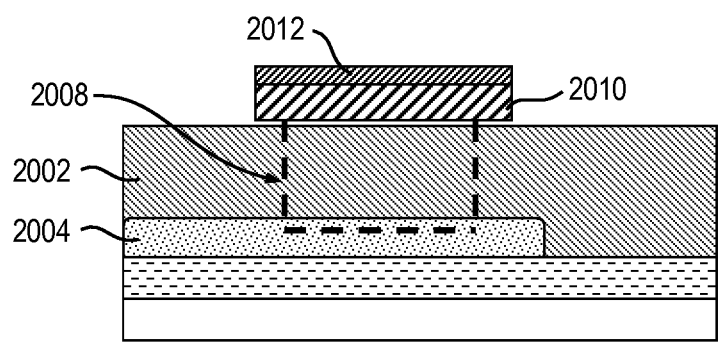

With reference now to FIGS. 20A through 20F, cross-sectional views, collectively, depict an exemplary BiCMOS process flow, according to an embodiment of the invention. The process flow uses a basic mask set for manufacturing circuit components based on modifications of the N-channel LDMOS device shown in FIG. 9, as described herein above. The process is based on an SOI substrate with a P$^-$ handle wafer, and an N$^-$ active layer. By way of example only and without limitation, an illustrative process flow in accordance with an embodiment of the invention includes the following primary steps:

Form a lateral dielectric isolation, also referred to as lateral trench isolation (LTI), by etching a trench through an active layer 2002, and filling the trench with oxide or a combination of oxide and polysilicon using a first mask step (LTI mask), as shown in FIG. 20A;

Deposit a thick field oxide and pattern it with the active area mask (active mask);

Deep implantation of boron, or an alternative dopant, to form a local deep $P^+$ well 2004, or alternatively an $N^+$ well as a function of the dopant employed, with a concentration peak close to an interface between the $P^+$ well (buried layer (BL)) 2004 and a buried oxide 2006 using a second mask step (deep well mask), as shown in FIG. 20A;

Pattern a mask to define a position of one or more gate trenches 2008 through the active layer 2002 into the buried well 2004 using a third mask step (trench gate mask), as shown in FIG. 20B; etch the gate trench with rounded bottom and top corners, grow a thermal gate oxide on the sidewalls and bottom wall of the gate trench, and fill the trench with polysilicon 2010, not explicitly shown but implied in FIG. 20B; in an alternative embodiment, the steps for forming the gate trench can be omitted, thereby simplifying the NFET structure shown in FIG. 9 to form the structure shown in FIG. 10.

Figure 20C:
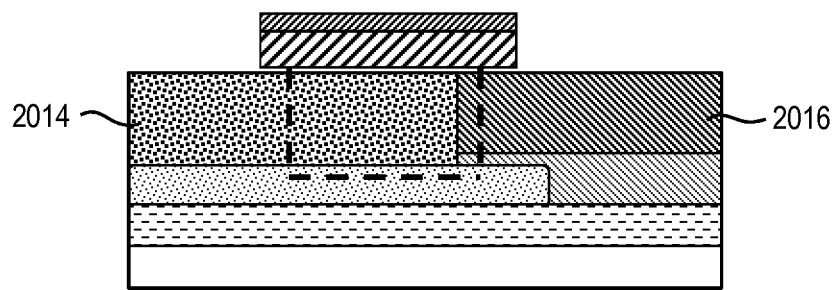
Figure 20D:
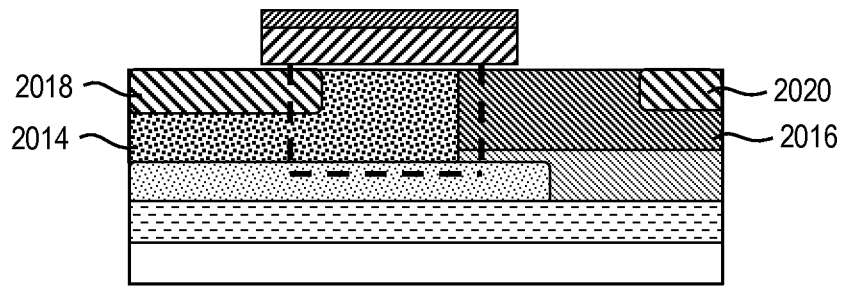
Figure 20E:
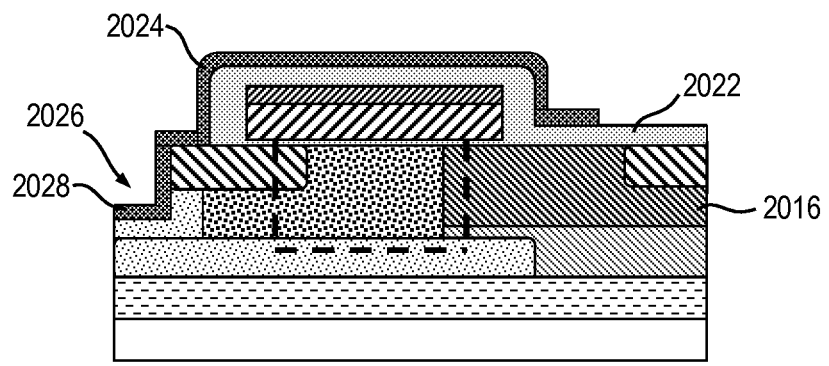
Figure 20F:
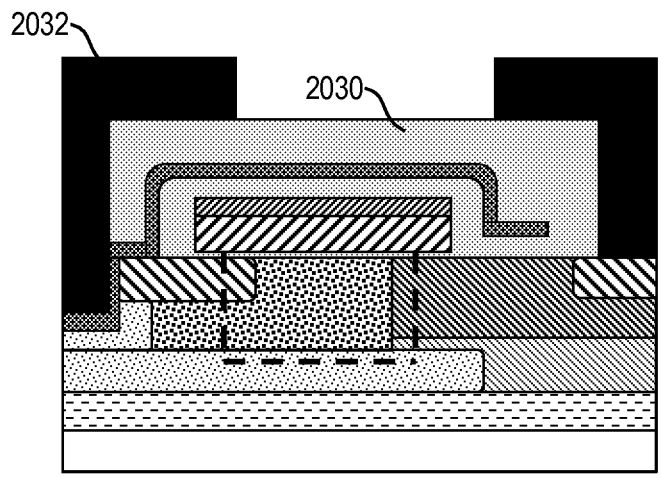

Dope the polysilicon 2010 by phosphor implantation, or an alternative dopant, and anneal, and deposit a silicide layer 2012 on the top, as shown in FIG. 20B;

Pattern the polycide layer 2012 to form a gate structure using a fourth mask level (polysilicon mask), as shown in FIG. 20B;

Implant boron to create a body region 2014 self-aligned to the edge of the polycide layer 2012 using a fifth mask step (body mask). Perform body diffusion, for example with a dedicated thermal anneal, as shown in FIG. 20C;

Implant phosphor or arsenic, or an alternative dopant, to create a lightly doped drain (LDD) extension 2016 at the other edge of the polycide layer 2012, opposite the edge used to form the body region 2014, using a sixth mask step (LDD mask), as shown in FIG. 20C;

Create highly-doped source region 218 and drain region 220 in the body region 2014 and LDD extension 2016, respectively, by shallow arsenic implantation using a seventh mask step (source/drain mask), as shown in FIG. 20D;

Deposit field oxide 2022 over a top surface of the structure to assure a pre-defined spacing of a field plate 2024 from the surface of the drain extension region 2016 as shown in FIG. 20E;

Etch a shallow source contact trench 2026 using an eighth mask step (trench contact mask), and implant $BF_2$ through the trench bottom (plug implant) to assure a good ohmic contact to the body and deep $P^+$ regions, as shown in FIG. 20E;

Deposit and sinter a silicide film 2028 (e.g., $Ti/WSi_x$ or Ti/TiN) lining the trench contact walls to create an electric short between source and body regions, as shown in FIG. 20E. During the sintering process, a silicide (e.g., $TiSi_x$) is created at the Si/Ti interface. Such a contact formation methodology is well known to those skilled in the art;

Pattern the contact silicide layer allowing a lateral extension to overlap the gate structure and create a field plate in the proximity of the LDD/oxide interface using a ninth mask step (field plate (FPL) mask), as shown in FIG. 20E;

Deposit an interlayer dielectric film (ILD) 2030 and apply a chemical-mechanical polishing step (CMP), or an alternative planarization process, to achieve a substantially planar top surface, as shown in FIG. 20F;

Etch via openings to access source, drain and gate contact areas using a tenth mask step (via mask). Fill vias with tungsten plugs (Ti/TiN/W), or an alternative conductive material, and apply a CMP step to planarize the top surface again, as shown in FIG. 20F; and Deposit and pattern a thick aluminum layer 2032 to create top electrodes with source, drain, and gate bus structures using an eleventh mask step (metal mask), as shown in FIG. 20F.

As discussed above, the processing of an N-channel LDMOS (NFET) transistor, in this embodiment, requires eleven mask levels (i.e., steps). The number of mask levels can be reduced to ten if the gate trench processing is omitted, as noted above. An optional mask can be used to create an electrical contact to the substrate by etching a deep trench through the active layer and the buried oxide, and filling it with oxide and doped polysilicon.

In order to create a P-channel MOSFET (PFET) using the same process flow, an additional mask subset is required. According to an illustrative embodiment of the invention, dedicated additional implants are made using the following mask levels: P-BL, P-POLYDOP, P-BODY, P-LDD, P-S/D, and P-CONT, where P-BL refers to a P-type doping of the buried layer, and P-POLYDOP refers to a mask level enabling $P^+$ doping of Polysilicon for the PFET devices. In this case an additional N-POLYDOP mask level is used for the N+ doping of polysilicon for NFET devices.

Thus, the complete mask set in the exemplary BiCMOS process, according to embodiments of the invention, includes a maximum of 18 to 20 levels. This process flow allows a design of all the exemplary electronic components shown in FIGS. 9 through 19 which may be used to manufacture a power IC.

The process flow using the basic mask set needed to manufacture diode power devices described herein is the same as discussed above for the BiCMOS technology. The process is based on an SOI substrate with a $P^-$ handle wafer, and an $N^-$ active layer in the case of an Nch MOSFET. This process flow can include the following main steps when forming diode structures disclosed herein:

Lateral dielectric isolation by etching a trench through the active layer, and fill it with oxide or a combination of oxide and polysilicon (LTI Mask);

Deep implantation of boron to create a local deep $P^+$ well with a concentration peak close to the buried oxide interface (BL Mask);

Pattern a mask to define the position of the Gate trenches (TRG Mask—optional);

Etch the gate trench with rounded bottom and top corners, grow a thermal Gate oxide, and fill the trench with polysilicon (optional—for structure like FIGS. 15-15B that include gate trenches only);

Dope the deposited polysilicon by phosphor implantation and anneal, and deposit a silicide layer on the top;

Pattern the polycide layer (POLY Mask);

Implant boron to create a body region self-aligned to the edge of the polycide layer for PN diodes, and self-aligned to the polycide layer openings used to form a button body contact in Schottky diodes. Perform body diffusion with a dedicated thermal anneal;

Implant phosphor or arsenic to create a lightly doped drain extension (called lightly doped drain (LDD)) at the other edge of the polycide layer (LDD Mask);

Create highly doped cathode regions by shallow arsenic implantation (S/D Mask);

Deposit field oxide to assure an electric isolation of the gate stack structure;

Etch a shallow source (anode) contact trench (CONT Mask) and implant $BF_2$ through the trench bottom (plug implant) to assure a good ohmic contact to body and deep $P^+$ regions.

Deposit and sinter a silicide film (e.g. Ti/TiN) lining the trench contact walls to create an electric short between anode, body and deep $P^+$ regions;

Pattern the contact silicide layer (FPL Mask);

Deposit an interlayer dielectric film (ILD) and apply chemical-mechanical polishing step (CMP) to achieve a planar top surface;

Etch via openings to access anode, cathode, and gate contact areas (Via Mask). Fill vias with tungsten plugs (Ti/TiN/W) and apply CMP step to planarize the top surface again.

Perform a two-step RTP anneal to stabilize the Schottky contact barrier.

Deposit and pattern thick Al layer to create top electrodes with anode, cathode, and gate bus structures (Metal Mask).

As discussed above this technology requires few mask levels. An optional mask can be used to create an electrical contact to the substrate by etching a deep trench through the active layer and the buried oxide, and fill it with oxide and doped polysilicon.

Processing details are well known to those skilled in the art and will therefore not be presented in further detail herein. By way of example only and without limitation, illustrative values for certain technological process parameters are listed below for the case of fabricating an exemplary 20-volt N-channel MOSFET:

SOI substrate: lightly doped handle wafer (e.g., <5e14 $cm^{-3}$), 0.3-µm buried oxide, and 0.6-µm active film with a doping of around 1e16 $cm^{-3}$.

Buried $P^+$ well: Boron implant with a dose of 2e13 $cm^{-2}$ and energy of 180 keV.

Gate trench: 0.3 µm wide, 0.3 µm deep, and 0.3 µm long.

Polycide layer: 0.3-µm polysilicon and 0.1-µm $WSi_2$. Polycide stripe width 0.45 µm covering gate trench, or 0.35 µm for the case of the NFET without gate trenches Body region: Boron implant with a dose of 3e13 $cm^{-2}$ and energy of 30 keV, followed by a second boron implant with a dose of 4e13 $cm^{-2}$ and energy of 90 keV, and a 60 minutes anneal at 1000° C.

LDD region: Phosphor implant with a dose of 6e12 $cm^{-2}$ and energy of 60 keV.

S/D regions: Arsenic implant with a dose of 5e15 $cm^{-2}$ and energy of 30 keV.

Contact trench: 0.4 µm wide and 0.25 µm deep.

Silicide film: Ti (300 Angstroms)/TiN (800 Angstroms) annealed at 800° C.

Plug implant: $BF_2$ implant with a dose of 7e14 $cm^{-2}$ and energy of 30 keV.

Top metal: AlSiCu (1.5 µm thickness) patterned with 0.5 µm metal-to-metal spacing.

The basic mask set needed to manufacture a NPN transistor as discussed above can be used to form a power SOI BJT as described above in connection with FIG. 12A-12D, or 12E as the case may be. The process is based on an SOI substrate with a $P^-$ handle wafer, and an $N^-$ active layer and can include the following main steps:

Lateral dielectric isolation by etching a trench through the active layer, and fill it with oxide or a combination of oxide and polysilicon (LTI Mask).

Deep implantation of boron to create a local deep P+ well with a concentration peak close to the buried oxide interface (BL Mask).

Deposit and dope a polysilicon layer by phosphor implantation and anneal. Deposit a silicide layer on the top.

Pattern the polycide layer (POLY Mask).

Implant boron to create a base region self-aligned to the edge of the polycide layer (BODY Mask). Perform base diffusion with a dedicated thermal anneal (e.g., 1000° C. for 60 min) to drive the implant under the whole length of the base/gate.

Implant phosphorous or arsenic to create a lightly doped collector extension (similar to the LDD in the LDMOS structure) (LDD Mask).

Create highly doped emitter and collector regions by shallow arsenic implantation (S/D Mask).

Etch a shallow button contact trench (CONT Mask) and implant $BF_2$ through the trench bottom (plug implant) to assure a good Ohmic contact to base and deep P+ regions.

Deposit and sinter a silicide film (e.g. Ti/TiN) lining the trench contact walls.

Pattern the contact silicide layer allowing a lateral extension to a small overlap of the polycide layer to create an electric contact between the deep P+ well and the polycide layer. As with the MOSFET process, this same mask can be used to define the optional field plate extension Deposit an interlayer dielectric film (ILD) and apply chemo-mechanical polishing step (CMP) to achieve a planar top surface.

Etch via openings to access emitter, collector and base contact areas (VIA Mask). Fill vias with tungsten plugs (Ti/TiN/W) and apply CMP step to planarize the top surface again.

Deposit and pattern thick Al layer to create top electrodes with emitter, collector, and base bus structures (METAL Mask).

As discussed above the processing of an NPN transistor requires 10 mask levels. An optional mask can be used to create an electrical contact to the substrate by etching a deep trench through the active layer and the buried oxide, and fill it with oxide and doped Polysilicon.

In order to create a PNP BJT in the same process flow, an modified mask sub-set has to be used. Dedicated, additional implants are made using the following mask levels:

P-BL, P-POLYDOP, P-BODY, P-LDD, P-S/D, and P-CONT.

Both types of BJT transistors can be integrated within an SOI-BiCMOS process flow with maximum of 18 mask levels as discussed in the disclosure on SOI-BiCMOS. This process flow allows a design of variety of electric components which may be used to manufacture a power IC.

The processing details are well known to people skilled in the art. Values of the critical technological parameters are listed above for the case of a 20V BiCMOS technology used as an example In embodiments, the source and drain busses are placed at the opposite ends of the transistor active cells with a gate bus created by the polycide layer running along the center of the layout. The source and drain metal contacts have an interleaved finger structure, and their pitch equals the pitch of one active cell as shown in, for example, 9A, 10, 10A, 11 or 19. A predefined number of active cells is connected together through the bus structure into a large macro-cell with lateral dimension of a few hundred microns (e.g. 300 by 300 µm). This macro-cell approach enables a transistor layout scalable to a large area (e.g. 1 to 5 $mm^2$) by repetition and connection of the predefined macro-cells. Various techniques for forming macro-cells comprising a number of individual active cells (e.g., checkerboard layout) and repeating grouping those macro-cells together to function as an individual device are described in, for example, U.S. Pat. No. 7,446,375, issued Nov. 4, 2008, the entirety of which is hereby incorporated by reference herein. However, unlike the '375 patent, which describes a device with vertical current flow to a backside electrode, both source and drain terminals and source and drain busses of the present LDMOS power device embodiments, which employ lateral current flow, would be formed on a top side of the semiconductor substrate. It should be understood that this macro-cell approach is applicable to all power devices disclosed herein, including MOSFET and BJT transistors and diodes.

Features and advantages achieved according to embodiments of the invention include, but are not limited to, one or more of the following, although a given embodiment may not necessarily include all of these features or only these features:

- Exploits unique aspects of the BiCMOS process, like manufacturing of all integrated power devices with the same set of process steps;
- Doping and placement of the deep buried well defines the breakdown voltage and the location of avalanche impact ionization within all SOI power devices; i.e., a clamping diode is effectively integrated in the device, thereby assuring high avalanche ruggedness;
- BiCMOS process flow is defined with an aim to minimize SOI-LDMOS power losses in SMPS applications. Other power devices like PN diodes Schottky diodes, and BJTs are obtained by modification of the SOI-LDMOS structure;
- PN diode is obtained by removing N+ source region from N-channel LDMOS structure;
- Schottky diode is obtained by removing P body region from the PN diode structure;
- Bipolar transistor is obtained by removing the electrical short between source and body regions. Gate stack is connected to the body region and builds a current bus structure used as a base terminal;
- Chip scale package (CSP) or wafer level packaging (WLP) is adopted to create current terminals on the top surface of the finished die.

Figure 23:
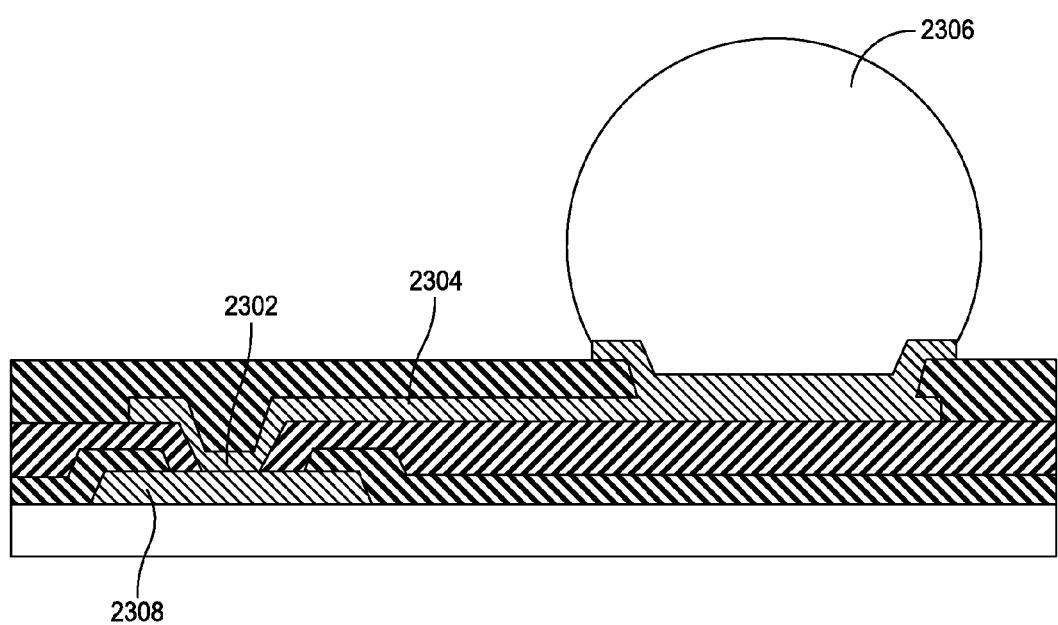
FIG. 23 is a cross-sectional view illustrating a chip-scale assembly.

In the case of a wired package, the current bus stripes lead to terminal pad areas. If a chip-scale assembly (CSP or WLP) is adopted, which has the advantage of a smaller product footprint and less parasitic components like package resistance and inductance, then the current bus structure 2308 (which corresponds to, for example, gate, drain and source top electrodes 2032 (or other contacts in the case of diode or BJT embodiments)) is contacted to a ball contact 2306 through vias 2302 and a redistribution layer 2304, as shown schematically in FIG. 23. Returning to the earlier discussion regarding macro-cells, individual source, drain and gate busses can be connected to multiple source, drain and gate terminals, of multiple like or identical devices, thereby allowing those multiple devices to operate as a single macro-cell device. Multiple macro-cell devices can then be connected together to operate as one power device by, for example, the redistribution layer 2304. That is, an individual contact 2306 can be connected to multiple source busses 2308, for example, and the like for the gate and drain contacts 2306.

As previously stated, an important benefit of embodiments of the invention is the ability to easily facilitate the integration of power circuits and/or components (e.g., drivers and power switches) on the same silicon substrate as corresponding control circuitry for implementing a power control device. By way of example only and without limitation, FIGS. 21A through 22E are cross-sectional views depicting at least a portion of an exemplary BiCMOS process flow for integrating two power devices on the same substrate, according to an embodiment of the invention. Specifically, FIGS. 21A through 22E conceptually illustrate an exemplary process flow which utilizes the same process steps for integrating a power N-channel MOSFET and a power Schottky diode on a common SOI substrate. Other devices, such as, for example, PN diodes and BJTs, can be fabricated within the same process step sequence.

Figure 21A:
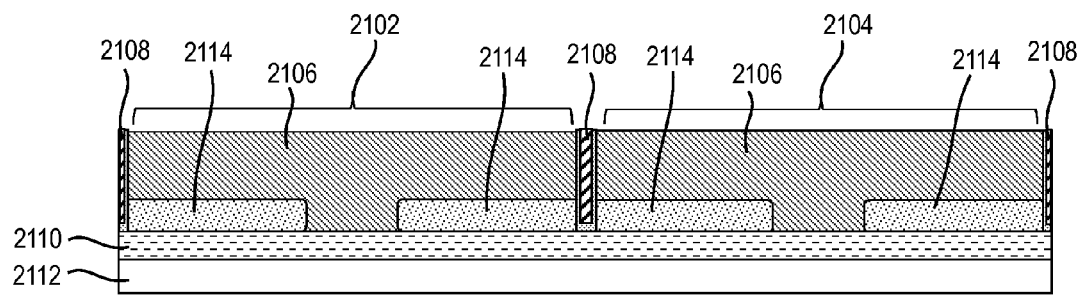
FIGS. 21A through 21E are cross-sectional views depicting at least a portion of an exemplary BiCMOS process flow for integrating two power devices on the same SOI substrate, according to an embodiment of the invention.

With reference to FIG. 21A, at least two active regions 2102 and 2104 are shown. Each of the active regions 2102 and 2104 in which devices will be formed, in this embodiment, comprise respective N⁻ active regions 2106 separated by a lateral isolation trench 2108, although the active regions 2106 may be of a different conductivity type in other embodiments. Lateral isolation trenches 2108 are used to separate other adjacent active regions 2106 for forming other devices and/or structures. Using process steps previously described, the active regions 2106 are formed on a common buried oxide layer 2110 which in turn is formed on an N or P-type substrate 2112. Buried P+ wells 2114 are formed in the respective N⁻ active regions 2106, proximate an interface between the buried oxide layer 2110 and the active regions.

Figure 21B:
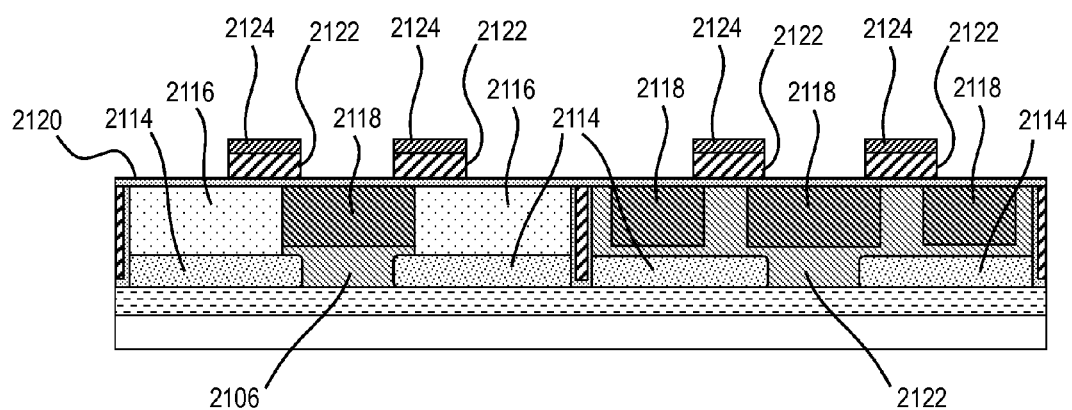
Figure 21C:
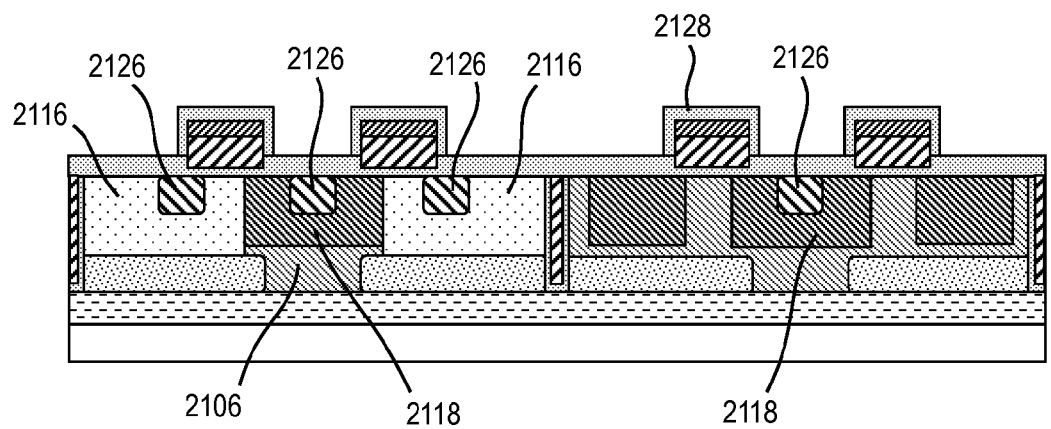

In FIG. 21B, a gate oxide layer 2120 is formed over the surface of the SOI structure. A layer of polysilicon 2122 is deposited on the gate oxide layer 2120 and patterned to form gate structures. A silicide layer 2124 is optionally deposited on the polysilicon gate structures 2122. Then, P body regions 2116 are formed by doping the active region 2106 over at least a portion of the buried wells 2114, whereby the P implant used to form the P body regions is self-aligned to one edge of the polycide regions. N regions 2118 are also formed in the active layer 2106. In active region 2102, the N region 2118 is formed between the P body regions 2116 allocated to build a MOSFET structure (e.g., NMOS device 1000 shown in FIG. 10). The same implantation step is used to form N regions 2118 in the structure of a Schottky diode, as previously shown in FIG. 14B. FIG. 21C shows doped N+ regions 2126 formed in P body regions 2116 and N regions 2118. An oxide layer 2128 is formed over at least a portion of the upper surface of the SOI structure.

Figure 21D:
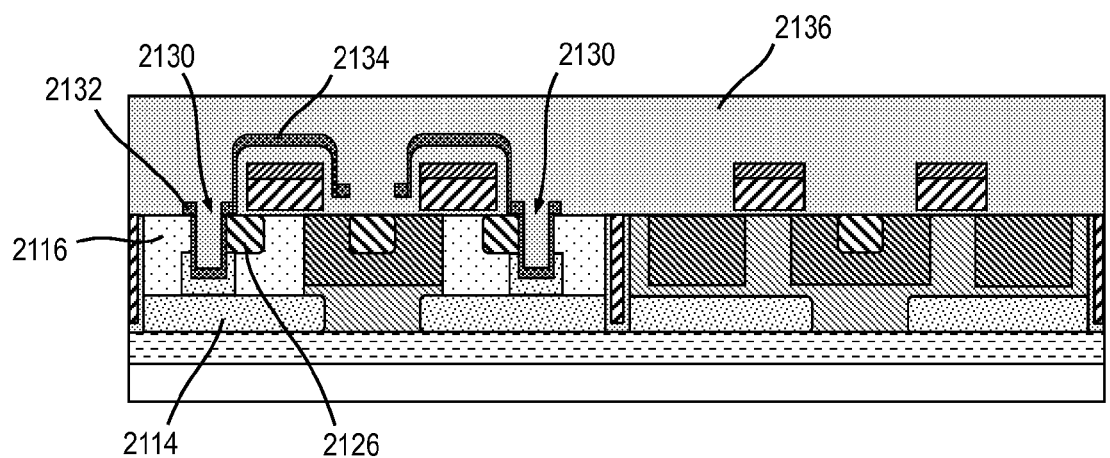
Figure 21E:
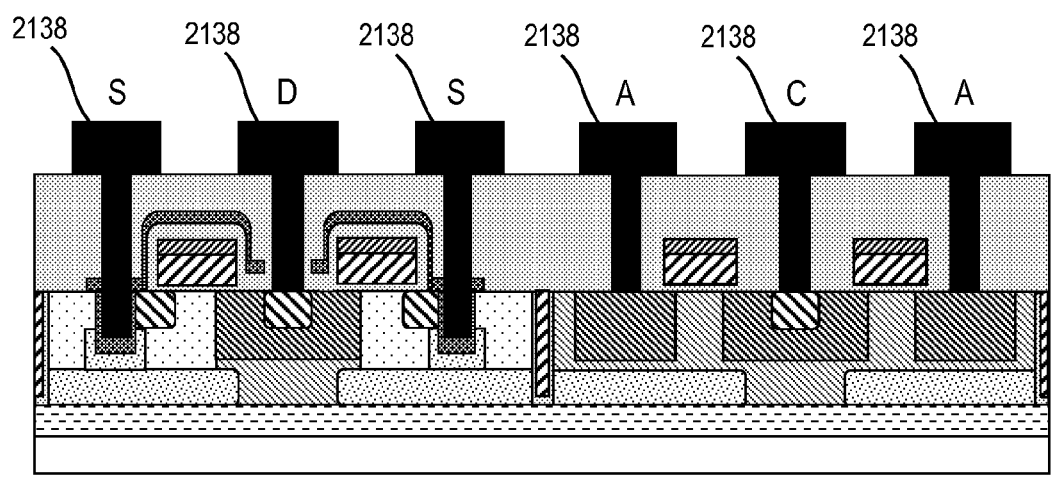

With reference to FIG. 21D, trenches 2130 are formed substantially vertically through the oxide layer 2128, the P body region 2116, and contacting the buried P+ well 2114. A silicide or titanium/titanium nitride layer 2132 is formed on sidewalls and a bottom wall of the trenches 2130. The silicide layer 2132 lining the trenches 2130 contact the N+ doped regions 2126 in the P body region 2116. Shield field plates 2134, which in this embodiment are formed as lateral extensions of the silicide layers 2132 lining the trenches 2130, overlap the gate structures and come into close proximity with an oxide interface along the N active region 2118. An oxide layer 2136 is then formed over at least a portion of the upper surface of the SOI structure. FIG. 21E depicts the oxide layer 2136 etched to form contact trenches (i.e., vias), which are subsequently filled with a metal (e.g., aluminum), or an alternative conductive material, to form device contacts 2138.

At least a portion of the embodiments of the invention may be implemented in an integrated circuit. In forming integrated circuits, identical die are typically fabricated in a repeated pattern on a surface of a semiconductor wafer. Each die includes at least one device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with embodiments of the invention can be employed in essentially any application and/or electronic system in which power management techniques may be employed. Suitable applications and systems for implementing techniques according to embodiments of the invention may include, but are not limited to, portable devices, including smart phones, laptop and tablet computing devices, netbooks, etc. Systems incorporating such integrated circuits are considered part of embodiments of the invention. Given the teachings of embodiments of the invention provided herein, one of ordinary skill in the art will be able to contemplate other implementations and applications of the techniques of embodiments of the invention.

The illustrations of embodiments of the invention described herein are intended to provide a general understanding of the structure of various embodiments, and they are not intended to serve as a complete description of all the elements and features of apparatus and systems that might make use of the structures described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the inventive subject matter are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description of Preferred Embodiments, it can be seen that various features are grouped together in a single embodiment for the purpose of streamlining the disclosure. This method of disclosure is not to be interpreted as reflecting an intention that the claimed embodiments require more features than are expressly recited in each claim.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the invention.

What is claimed is:

1. A semiconductor structure comprising at least one Schottky diode power device, the semiconductor structure comprising:
   a first insulating layer formed on a substrate;
   an active region formed on at least a portion of the first insulating layer;
   a buried well having a first conductivity type formed in the active region;
   a cathode region having a second conductivity type formed in the active region proximate the upper surface of the active region;
   a cathode terminal formed on an upper surface of active region and electrically connecting with the cathode region;
   an anode terminal electrically connecting with the active region and the buried well at a region spaced laterally from the cathode region, wherein a Schottky barrier is formed between the anode terminal and the active region; and
   the buried well being configured, in conjunction with the active region, to form a clamping diode operative to position a breakdown avalanche region between the buried well and the cathode terminal, a breakdown voltage of the Schottky diode power device being a function of one or more characteristics of the buried well.

2. The semiconductor structure of claim 1, wherein the Schottky diode further comprises a gate structure formed above the active region proximate the upper surface of the active region and at least partially between the cathode and anode terminals, the gate structure overlapping at least a portion of the buried well and the cathode region, the gate structure being electrically connected with the anode terminal, wherein the gate structure is configured to control an electric field distribution proximate the junction between the cathode region and the active region.

3. The semiconductor structure of claim 2, further comprising a shielding structure formed proximate the upper surface of the active region between the gate structure and the cathode region, the shielding structure comprising a field plate configured to control an electric field distribution along a top oxide interface away from an edge of the gate structure nearest the cathode terminal.

4. The semiconductor structure of claim 3, wherein the cathode region includes an first cathode implant region partially underlying the gate structure and extending to a more heavily doped second cathode implant region, the more heavily doped second cathode implant region being in electrical contact to and underlying the cathode terminal.

5. The semiconductor structure of claim 4, further comprising an implant region of the second conductivity type formed proximate an upper surface of the active region, the implant region of the second conductivity type partially underlying the gate structure and extending to underlie and make electrical contact to the anode terminal, wherein the Schottky barrier is formed between the anode terminal and the implant region of the second conductivity type.

6. The semiconductor structure of claim 1, wherein the Schottky diode further comprises:
   an implant region of the second conductivity type formed proximate an upper surface of the active region and making electrical contact to the anode terminal, wherein the Schottky barrier is formed between the anode terminal and the implant region of the second conductivity type;
   a gate structure formed above the active region proximate the upper surface of the active region and at least partially between the cathode and anode terminals, the gate structure overlapping at least a portion of the implant region of the second conductivity type, the active region and the cathode region, the gate structure being electrically isolated from the anode terminal, the gate structure being operative to induce a pinching of the electric field distribution under an applied blocking bias of the cathode terminal to thereby shield the Schottky barrier against an electric field greater than a prescribed level under blocking conditions.

7. The semiconductor structure of claim 6, wherein the Schottky diode further comprises:
a plurality of trench structures formed substantially vertically through the active region and into the buried well, each of the trenches including sidewalls and a bottom wall having an insulating material formed thereon, each of the trenches being filled with a conductive material, the trenches connecting with the gate structure, wherein a voltage applied to the gate structure is operative to modulate a conduction current which flows between at least two of the trenches, an amplitude of the conduction current being controlled as a function of the applied voltage.

8. The semiconductor structure of claim 1, wherein the buried well is formed proximate an interface between the first insulating layer and the active region.

9. The semiconductor structure of claim 1, wherein the at least one Schottky diode power device comprises a plurality of said at least one Schottky diode power devices formed therein and organized in a macro-cell, and the semiconductor structure comprises a plurality of said macro-cells connected together to operate as a single Schottky diode power device.

10. The semiconductor structure of claim 1, wherein the at least one Schottky diode power device comprises a plurality of like Schottky diode power devices formed therein and connected together through a bus structure to operate as a single Schottky diode power device, wherein the semiconductor structure is part of a chip-scale assembly, the chip-scale assembly comprising a redistribution layer coupling the bus structure to anode and cathode external contacts.

* * * * *